(12) United States Patent
Cox

(10) Patent No.: US 10,392,502 B2
(45) Date of Patent: *Aug. 27, 2019

(54) INFORMATION CARRYING CARD COMPRISING A CROSS-LINKED POLYMER COMPOSITION, AND METHOD OF MAKING THE SAME

(71) Applicant: X-Card Holdings, LLC, West Chester, PA (US)

(72) Inventor: Mark A. Cox, West Chester, PA (US)

(73) Assignee: X-CARD HOLDINGS, LLC, West Chester, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/606,944

(22) Filed: May 26, 2017

(65) Prior Publication Data

US 2017/0260385 A1 Sep. 14, 2017

Related U.S. Application Data

(63) Continuation of application No. 14/806,272, filed on Jul. 22, 2015, now Pat. No. 9,688,850, which is a
(Continued)

(51) Int. Cl.
*H05K 1/03* (2006.01)
*H05K 1/18* (2006.01)
(Continued)

(52) U.S. Cl.
CPC ............. *C08L 33/14* (2013.01); *B32B 3/08* (2013.01); *B32B 3/26* (2013.01); *B32B 27/08* (2013.01);
(Continued)

(58) Field of Classification Search
CPC ........ H05K 7/02; H05K 1/183; H05K 1/0313; G06K 19/07745; G06K 19/07722
See application file for complete search history.

(56) References Cited

U.S. PATENT DOCUMENTS

| 2,890,202 A | 6/1959 | Parker |
| 3,024,216 A | 3/1962 | Smitmans et al. |

(Continued)

FOREIGN PATENT DOCUMENTS

| CN | 1279797 A | 1/2001 |
| CN | 1305618 A | 7/2001 |

(Continued)

OTHER PUBLICATIONS

"Material Safety Data Sheet for Rigid PVC (Vinyl) Films," Klöockner Pentaplast of America, Inc., Rev. Mar. 2010.
(Continued)

*Primary Examiner* — Nathan Milakovich
(74) *Attorney, Agent, or Firm* — Duane Morris LLP

(57) ABSTRACT

The disclosure provides a cross-linkable polymer composition, a core layer for an information carrying card comprising such cross-linked composition, resulting information carrying card, and methods of making the same. A cross-linkable polymer composition comprises a curable base polymer resin in a liquid or paste form, and a particulate thermoplastic filler. The base polymer resin is selected from the group consisting of urethane acrylate, silicone acrylate, epoxy acrylate, urethane, acrylate, silicone and epoxy. The particulate thermoplastic filler may be polyolefin, polyvinyl chloride (PVC), a copolymer of vinyl chloride and at least another monomer, or a polyester such as polyethylene terephthalate (PET), a compound or blend thereof.

19 Claims, 15 Drawing Sheets

Related U.S. Application Data continuation of application No. 13/647,982, filed on Oct. 9, 2012, now Pat. No. 9,122,968.

(60) Provisional application No. 61/619,700, filed on Apr. 3, 2012.

(51) Int. Cl.
| | | |
|---|---|---|
| *G06K 19/077* | (2006.01) | |
| *C08L 33/14* | (2006.01) | |
| *B32B 3/08* | (2006.01) | |
| *B32B 27/20* | (2006.01) | |
| *C08L 75/04* | (2006.01) | |
| *C08L 75/06* | (2006.01) | |
| *C08L 75/14* | (2006.01) | |
| *C08L 75/16* | (2006.01) | |
| *B32B 27/08* | (2006.01) | |
| *B32B 3/26* | (2006.01) | |
| *B32B 37/06* | (2006.01) | |
| *B32B 37/08* | (2006.01) | |
| *B32B 37/10* | (2006.01) | |
| *C08L 27/06* | (2006.01) | |

(52) U.S. Cl.
CPC ............. *B32B 27/20* (2013.01); *B32B 37/06* (2013.01); *B32B 37/08* (2013.01); *B32B 37/10* (2013.01); *C08L 27/06* (2013.01); *C08L 75/04* (2013.01); *C08L 75/06* (2013.01); *C08L 75/14* (2013.01); *C08L 75/16* (2013.01); *G06K 19/07722* (2013.01); *G06K 19/07745* (2013.01); *H05K 1/0313* (2013.01); *H05K 1/183* (2013.01); *B32B 2250/40* (2013.01); *B32B 2264/02* (2013.01); *B32B 2307/748* (2013.01); *B32B 2307/75* (2013.01); *B32B 2425/00* (2013.01); *B32B 2457/00* (2013.01); *B32B 2457/08* (2013.01); *C08L 2203/206* (2013.01); *H01L 2924/0002* (2013.01); *H05K 2201/09036* (2013.01); *H05K 2201/10037* (2013.01); *Y10T 29/49126* (2015.01); *Y10T 428/24612* (2015.01); *Y10T 428/31511* (2015.04); *Y10T 428/31529* (2015.04); *Y10T 428/31598* (2015.04); *Y10T 428/31605* (2015.04); *Y10T 428/31663* (2015.04); *Y10T 428/31667* (2015.04); *Y10T 428/31692* (2015.04); *Y10T 428/31699* (2015.04)

(56) References Cited

U.S. PATENT DOCUMENTS

| | | | |
|---|---|---|---|
| 4,115,479 A | 9/1978 | Diadone | |
| 4,117,036 A | 9/1978 | Honda et al. | |
| 4,310,451 A | 1/1982 | Ernest et al. | |
| 4,322,170 A | 3/1982 | Papenmeier | |
| 4,382,201 A | 5/1983 | Trzaskos | |
| 4,399,061 A | 8/1983 | Sickert | |
| 4,463,128 A | 7/1984 | Lin | |
| 4,480,079 A | 10/1984 | Orton et al. | |
| 4,627,642 A | 12/1986 | Peronneau et al. | |
| 4,640,636 A | 2/1987 | Hofmann | |
| 4,742,085 A | 5/1988 | Cozens | |
| 4,743,636 A | 5/1988 | Bersano | |
| 4,754,319 A | 6/1988 | Saito et al. | |
| 4,769,278 A | 9/1988 | Kamimura et al. | |
| 4,775,698 A | 10/1988 | Cozens | |
| 4,775,699 A | 10/1988 | Cozens | |
| 4,775,700 A | 10/1988 | Cozens | |
| 4,775,701 A | 10/1988 | Cozens | |
| 4,775,702 A | 10/1988 | Cozens | |
| 4,801,418 A | 1/1989 | Bersano | |
| 4,843,225 A * | 6/1989 | Hoppe | G06K 19/07745 235/488 |
| 4,929,171 A | 5/1990 | Hayashi | |
| 4,954,195 A | 9/1990 | Turpin | |
| 5,013,900 A | 5/1991 | Hoppe | |
| 5,084,501 A | 1/1992 | Drout et al. | |
| 5,126,396 A | 6/1992 | Orton et al. | |
| 5,143,723 A | 9/1992 | Calvo et al. | |
| 5,198,170 A | 3/1993 | Hawrylko | |
| 5,198,501 A | 3/1993 | Bott et al. | |
| 5,233,022 A | 8/1993 | Donatti et al. | |
| 5,255,430 A | 10/1993 | Tallaksen | |
| 5,276,106 A | 1/1994 | Portelli et al. | |
| 5,286,437 A | 2/1994 | Severiens | |
| 5,298,542 A | 3/1994 | Nakamura | |
| 5,319,028 A | 6/1994 | Nakamura | |
| 5,324,506 A | 6/1994 | Calvo et al. | |
| 5,407,617 A | 4/1995 | Oppermann et al. | |
| 5,407,893 A | 4/1995 | Koshizuka et al. | |
| 5,462,996 A | 10/1995 | Portelli et al. | |
| 5,599,765 A | 2/1997 | Ohshima et al. | |
| 5,626,958 A | 5/1997 | D'Herbecourt et al. | |
| 5,672,646 A | 9/1997 | Allas et al. | |
| 5,690,773 A | 11/1997 | Fidalgo et al. | |
| 5,767,503 A | 6/1998 | Gloton | |
| 5,822,194 A * | 10/1998 | Horiba | G06K 19/077 174/250 |
| 5,955,021 A | 9/1999 | Tiffany, III | |
| 5,955,198 A | 9/1999 | Hashimoto et al. | |
| 5,972,514 A | 10/1999 | D'Herbecourt et al. | |
| 5,975,420 A | 11/1999 | Gogami et al. | |
| 6,037,879 A | 3/2000 | Tuttle | |
| 6,052,062 A | 4/2000 | Tuttle | |
| 6,100,804 A | 8/2000 | Brady et al. | |
| 6,217,685 B1 | 4/2001 | Leydier | |
| 6,330,464 B1 | 12/2001 | Colvin, Jr. et al. | |
| 6,376,769 B1 | 4/2002 | Chung | |
| 6,380,272 B1 | 4/2002 | Chen | |
| 6,380,845 B2 | 4/2002 | Tuttle | |
| 6,406,757 B1 | 6/2002 | Blatter et al. | |
| 6,423,760 B1 | 7/2002 | Qiao et al. | |
| 6,441,085 B1 | 8/2002 | Saethre et al. | |
| 6,446,874 B1 | 9/2002 | Elbaz et al. | |
| 6,462,273 B1 | 10/2002 | Corisis et al. | |
| 6,468,835 B1 | 10/2002 | Blanc et al. | |
| 6,477,926 B1 | 11/2002 | Swisher et al. | |
| 6,495,127 B1 | 12/2002 | Wallace et al. | |
| 6,521,985 B1 | 2/2003 | Dossetto | |
| 6,534,588 B1 | 3/2003 | Löcken et al. | |
| 6,551,537 B2 | 4/2003 | Chen | |
| 6,611,050 B1 | 8/2003 | Ference et al. | |
| 6,624,212 B2 | 9/2003 | Weier et al. | |
| 6,639,309 B2 | 10/2003 | Wallace | |
| 6,649,688 B1 | 11/2003 | Mayer et al. | |
| 6,653,394 B1 | 11/2003 | Meisenburg et al. | |
| 6,673,423 B2 | 1/2004 | Kranenburg-Van Dijk et al. | |
| 6,689,727 B1 | 2/2004 | Olsson | |
| 6,693,513 B2 | 2/2004 | Tuttle | |
| 6,730,734 B1 | 5/2004 | Hamilton et al. | |
| 6,765,289 B2 | 7/2004 | Nakata et al. | |
| 6,768,415 B1 | 7/2004 | Tuttle | |
| 6,780,897 B1 | 8/2004 | Blum et al. | |
| 6,784,230 B1 | 8/2004 | Patterson et al. | |
| 6,786,415 B2 | 9/2004 | Yiu | |
| 6,786,748 B2 | 9/2004 | Masson et al. | |
| 6,790,893 B2 | 9/2004 | Nguyen et al. | |
| 6,861,475 B2 | 3/2005 | Ilenda et al. | |
| 6,884,837 B2 | 4/2005 | Kohlhammer et al. | |
| 6,908,786 B2 | 6/2005 | Halope | |
| 6,918,984 B2 | 7/2005 | Murray et al. | |
| 6,943,437 B2 | 9/2005 | Blanc et al. | |
| 6,960,620 B2 | 11/2005 | Wenning et al. | |
| 6,984,205 B2 | 1/2006 | Gazdzinski | |
| 6,989,349 B2 | 1/2006 | Tatewaki et al. | |
| 7,012,504 B2 | 3/2006 | Tuttle | |
| 7,030,179 B2 | 4/2006 | Patterson et al. | |
| 7,137,148 B2 | 11/2006 | Tao et al. | |
| 7,147,625 B2 | 12/2006 | Sarangapani et al. | |
| 7,217,747 B2 | 5/2007 | Weier et al. | |

(56) References Cited

U.S. PATENT DOCUMENTS

| | | |
|---|---|---|
| 7,221,257 B1 | 5/2007 | Tuttle |
| 7,237,724 B2 | 7/2007 | Singleton |
| 7,377,446 B2 | 5/2008 | Ohta et al. |
| 7,382,045 B2 | 6/2008 | Osako et al. |
| 7,433,655 B2 | 10/2008 | Jacobs et al. |
| 7,511,371 B2 | 3/2009 | Wallace |
| 7,528,191 B2 | 5/2009 | Metzemacher et al. |
| 7,545,336 B2 | 6/2009 | Naito |
| 7,566,001 B2* | 7/2009 | Yamazaki .......... G06K 19/0704 235/380 |
| 7,592,394 B2 | 9/2009 | Yang et al. |
| 7,597,266 B2 | 10/2009 | Benato |
| 7,601,563 B2 | 10/2009 | Chen et al. |
| 7,608,306 B2 | 10/2009 | Hasskerl et al. |
| 7,668,588 B2 | 2/2010 | Kovacs |
| 7,795,077 B2 | 9/2010 | Tsai et al. |
| 7,868,441 B2 | 1/2011 | Eaton et al. |
| 7,877,120 B2 | 1/2011 | Jacobs et al. |
| 7,917,298 B1 | 3/2011 | Scher et al. |
| 7,939,920 B2 | 5/2011 | Wallace |
| 7,954,724 B2* | 6/2011 | Poidomani ......... G06K 19/0702 235/375 |
| 7,989,268 B2 | 8/2011 | Chen et al. |
| 8,012,809 B2 | 9/2011 | Reed |
| 8,017,147 B2 | 9/2011 | Mazed et al. |
| 8,034,153 B2 | 10/2011 | Marchiando et al. |
| 8,044,508 B2 | 10/2011 | Jenson et al. |
| 8,231,063 B2 | 7/2012 | Poidomani et al. |
| 8,382,000 B2 | 2/2013 | Mullen et al. |
| 8,424,773 B2 | 4/2013 | Mullen et al. |
| 8,540,165 B2 | 9/2013 | Foo et al. |
| 8,551,387 B2 | 10/2013 | Feldman et al. |
| 8,608,080 B2 | 12/2013 | Finn |
| 8,673,452 B2 | 3/2014 | Petzoldt et al. |
| 8,678,276 B2 | 3/2014 | Poidomani et al. |
| 9,122,968 B2 | 9/2015 | Cox |
| 9,183,486 B2 | 11/2015 | Cox |
| 9,439,334 B2 | 9/2016 | Cox |
| 10,127,489 B2* | 11/2018 | Cox .......................... H05K 13/00 |
| 2001/0034399 A1 | 10/2001 | Kohlhammer et al. |
| 2001/0043141 A1 | 11/2001 | Tuttle |
| 2002/0013387 A1 | 1/2002 | Weier et al. |
| 2002/0042452 A1 | 4/2002 | Chen |
| 2002/0055581 A1 | 5/2002 | Lorah et al. |
| 2002/0086908 A1 | 7/2002 | Chou et al. |
| 2002/0091178 A1 | 7/2002 | Amin-Javaheri |
| 2002/0119294 A1 | 8/2002 | Monkarsh et al. |
| 2002/0125431 A1 | 9/2002 | Hwang |
| 2002/0125598 A1 | 9/2002 | Chen |
| 2002/0131251 A1 | 9/2002 | Corisis et al. |
| 2002/0132086 A1 | 9/2002 | Su-Tuan |
| 2002/0140546 A1 | 10/2002 | Tuttle |
| 2002/0146549 A1 | 10/2002 | Kranenburg-Van Dijk et al. |
| 2003/0020182 A1 | 1/2003 | Blanc et al. |
| 2003/0105188 A1 | 6/2003 | Nguyen et al. |
| 2003/0153120 A1 | 8/2003 | Halope |
| 2003/0175433 A1 | 9/2003 | Wenning et al. |
| 2003/0183914 A1 | 10/2003 | Wallace |
| 2003/0216701 A1 | 11/2003 | Sumarta |
| 2003/0217517 A1 | 11/2003 | Allison et al. |
| 2004/0002559 A1 | 1/2004 | Troutman et al. |
| 2004/0023538 A1 | 2/2004 | Masson et al. |
| 2004/0036155 A1 | 2/2004 | Wallace |
| 2004/0077756 A1 | 4/2004 | Weier et al. |
| 2004/0077784 A1 | 4/2004 | Ilenda et al. |
| 2004/0083531 A1 | 5/2004 | Tao et al. |
| 2004/0145453 A1 | 7/2004 | Tuttle |
| 2004/0180476 A1 | 9/2004 | Kazlas et al. |
| 2004/0192794 A1 | 9/2004 | Patterson et al. |
| 2004/0216658 A1 | 11/2004 | Lin |
| 2004/0266940 A1 | 12/2004 | Issari |
| 2005/0004525 A1 | 1/2005 | Sarangapani et al. |
| 2005/0008604 A1 | 1/2005 | Schultz et al. |
| 2005/0023665 A1 | 2/2005 | Ledwidge |
| 2005/0025725 A1 | 2/2005 | Schultz et al. |
| 2005/0031870 A1 | 2/2005 | Liu et al. |
| 2005/0051536 A1 | 3/2005 | Shirlin et al. |
| 2005/0130840 A1 | 6/2005 | Tatewaki et al. |
| 2005/0182156 A1 | 8/2005 | Liu |
| 2005/0203242 A1 | 9/2005 | Nakayama et al. |
| 2005/0218551 A1 | 10/2005 | Halahmi et al. |
| 2005/0234154 A1 | 10/2005 | Halahmi |
| 2006/0042827 A1 | 3/2006 | Chou et al. |
| 2006/0079612 A1 | 4/2006 | Troutman et al. |
| 2006/0100378 A1 | 5/2006 | Wu |
| 2006/0134705 A1 | 6/2006 | Sundrehagen |
| 2006/0135705 A1 | 6/2006 | Vallance et al. |
| 2006/0155035 A1 | 7/2006 | Metzemacher et al. |
| 2006/0168802 A1 | 8/2006 | Tuttle |
| 2006/0181478 A1 | 8/2006 | Benato |
| 2007/0034700 A1 | 2/2007 | Poidomani et al. |
| 2007/0087230 A1 | 4/2007 | Jenson et al. |
| 2007/0096265 A1 | 5/2007 | Wallace |
| 2007/0103983 A1 | 5/2007 | Watanabe et al. |
| 2007/0104938 A1 | 5/2007 | Lin |
| 2007/0117276 A1 | 5/2007 | Chen et al. |
| 2007/0131144 A1 | 6/2007 | Winter et al. |
| 2007/0193643 A1 | 8/2007 | Jarvenkyla |
| 2007/0208233 A1 | 9/2007 | Kovacs |
| 2007/0208262 A1 | 9/2007 | Kovacs |
| 2007/0235548 A1 | 10/2007 | Singleton |
| 2007/0252705 A1 | 11/2007 | Halope et al. |
| 2007/0279232 A1 | 12/2007 | Halope et al. |
| 2008/0001715 A1 | 1/2008 | Tuttle |
| 2008/0073770 A1 | 3/2008 | Yee et al. |
| 2008/0096326 A1 | 4/2008 | Reed |
| 2008/0136160 A1 | 6/2008 | Leenders |
| 2008/0174438 A1 | 7/2008 | Tuttle |
| 2008/0194736 A1 | 8/2008 | Lu |
| 2008/0207837 A1 | 8/2008 | Weiss et al. |
| 2008/0249209 A1 | 10/2008 | Trummer et al. |
| 2008/0251906 A1 | 10/2008 | Eaton et al. |
| 2008/0262154 A1 | 10/2008 | Behrens et al. |
| 2008/0273299 A1 | 11/2008 | Tsai et al. |
| 2008/0282540 A1 | 11/2008 | Singleton |
| 2008/0299860 A1* | 12/2008 | Lee ...................... G06K 19/077 445/24 |
| 2008/0308641 A1 | 12/2008 | Finn |
| 2008/0315382 A1 | 12/2008 | Wallace |
| 2009/0017195 A1 | 1/2009 | Vallance et al. |
| 2009/0018248 A1 | 1/2009 | Pirri et al. |
| 2009/0020615 A1 | 1/2009 | Patel |
| 2009/0056591 A1 | 3/2009 | Schmidt et al. |
| 2009/0068556 A1 | 3/2009 | Jacobs et al. |
| 2009/0104367 A1 | 4/2009 | Simon |
| 2009/0127344 A1 | 5/2009 | Dostmann et al. |
| 2009/0130355 A1 | 5/2009 | Chen et al. |
| 2009/0131546 A1 | 5/2009 | Vazquez |
| 2009/0142981 A1 | 6/2009 | Arendt et al. |
| 2009/0168398 A1 | 7/2009 | Collier |
| 2009/0247369 A1 | 10/2009 | Chang |
| 2009/0252772 A1 | 10/2009 | Henglein et al. |
| 2009/0277663 A1 | 11/2009 | Valenta et al. |
| 2009/0283313 A1 | 11/2009 | Chen et al. |
| 2010/0012680 A1 | 1/2010 | Canfield et al. |
| 2010/0015408 A1 | 1/2010 | Fong et al. |
| 2010/0075104 A1 | 3/2010 | Dehennau et al. |
| 2010/0096166 A1 | 4/2010 | Fjelstad |
| 2010/0105273 A1 | 4/2010 | Motomura et al. |
| 2010/0144931 A1 | 6/2010 | Balduf |
| 2010/0179273 A1 | 7/2010 | Spyrou et al. |
| 2010/0249325 A1 | 9/2010 | Bothe et al. |
| 2010/0298469 A1 | 11/2010 | Kaupp et al. |
| 2010/0304118 A1 | 12/2010 | Baidak et al. |
| 2010/0321913 A1 | 12/2010 | Tsai et al. |
| 2011/0011939 A1 | 1/2011 | Seah |
| 2011/0097609 A1 | 4/2011 | Jenson et al. |
| 2011/0101109 A1 | 5/2011 | Bona et al. |
| 2011/0140744 A1 | 6/2011 | Kazlas et al. |
| 2011/0140841 A1 | 6/2011 | Bona et al. |
| 2011/0300413 A1 | 12/2011 | Jacobs et al. |
| 2011/0317355 A1 | 12/2011 | Jow |
| 2012/0206869 A1* | 8/2012 | Droz ................ G06K 19/07745 361/679.01 |

(56) References Cited

U.S. PATENT DOCUMENTS

| | | |
|---|---|---|
| 2013/0009347 A1 | 1/2013 | Feldman et al. |
| 2013/0255078 A1 | 10/2013 | Cox |
| 2013/0255848 A1 | 10/2013 | Cox |
| 2013/0258622 A1 | 10/2013 | Cox |
| 2013/0260065 A1 | 10/2013 | Cox |
| 2013/0261262 A1 | 10/2013 | Cox |
| 2015/0327365 A1 | 11/2015 | Cox |
| 2016/0031201 A1 | 2/2016 | Cox |
| 2016/0152815 A1 | 6/2016 | Cox |
| 2016/0203399 A1 | 7/2016 | Cox |
| 2016/0342881 A1 | 11/2016 | Cox |

FOREIGN PATENT DOCUMENTS

| | | |
|---|---|---|
| CN | 1351733 A | 5/2002 |
| DE | 19915765 A1 | 10/2000 |
| EP | 0350179 A1 | 1/1990 |
| EP | 0754567 | 1/1997 |
| EP | 2093704 | 8/2009 |
| EP | 2386428 | 11/2011 |
| JP | H7-93817 A | 4/1995 |
| JP | 2002-261421 A | 9/2002 |
| JP | 2005-004429 A | 1/2005 |
| JP | 2009-205337 A | 9/2009 |
| JP | 2010-250467 | 11/2010 |
| KR | 10-1990-0001745 B1 | 3/1990 |
| KR | 1020110058183 | 6/2011 |
| KR | 1020110062486 | 6/2011 |
| WO | WO 88/02762 A1 | 4/1988 |
| WO | WO 99/47331 A1 | 9/1999 |
| WO | WO 00/030031 A1 | 5/2000 |
| WO | WO 2014039183 A1 | 3/2014 |
| WO | WO 2015026612 A2 | 2/2015 |

OTHER PUBLICATIONS

"Material Safety Data Sheet acc. to ISO/DIS 11014 for Trade Name: 9-20557-LV," Dymax Corporation, Mar. 10, 2011.
"Material Safety Data Sheet acc. to ISO/DIS 11014 for Trade Name: 9-20557," Dymax Corporation, Sep. 21, 2011.
"Multi-Cure® 6-625-SV01-REV-A Adhesives for Metal, Glass and Plastics Product Data Sheet," Dymax Corporation, Sep. 24, 2010.
"Material Safety Data Sheet acc. to ISO/DIS 11014 for Trade Name: 6-625-REV-A," Dymax Corporation, Dec. 9, 2010.
"Product Specification Sheet for Vinyl Chloride/Vinyl Acetate Copolymer," The Dow Chemical Company, 1995, http://www.dow.com/svr/prod/vcvac.htm.
Wakana, Masahiko, "IC Card and its Manufacturing Method", Feb. 27, 2008, Japanese Patent Office. Detailed Description.
Database WPI Week 201150 Thomson Scientific. London. GB; AN 2011-J56990 XP002750795. & JP 2011 144213 A (Toray Ind Inc) Jul. 28, 2011 (Jul. 28, 2011) * abstract *.
Database WPI Week 201023 Thomson Scientific. London. GB; AN 2010-C93048 XP002750796. & JP 2010 059225 A (Toray Ind Inc) Mar. 18, 2010 (Mar. 18, 2010) * abstract *.
PCT International Search Report for PCT Application No. PCT/US2013/052814 dated Nov. 26, 2013, pp. 1-3.
PCT International Search Report for PCT Application No. PCT/US2013/033784 dated Jul. 2, 2013, 4 pages.
PCT International Search Report for PCT Application No. PCT/US2013/034216 dated Jun. 26, 2013, 4 pages.
PCT International Search Report for PCT Application No. PCT/US2013/033963 dated Aug. 12, 2013, 4 pages.
PCT International Search Report for PCT Application No. PCT/US2013/052815 dated Nov. 26, 2013, pp. 1-3.
PCT International Search Report and Written Opinion for PCT Application No. PCT/US2014/050987 dated Feb. 11, 2015, pp. 1-10.
PCT International Preliminary Report on Patentability for PCT Application No. PCT/US2013/052814 dated Mar. 10, 2015, pp. 1-6.
International Search Report issued for PCT patent application No. PCT/US2014/021548, dated Jul. 14, 2014, 14 pages.
International Search Report issued for PCT patent application No. PCT/US2014/021553, dated Jul. 11, 2014, 11 pages.
Supplementary European Search Report issued in connection with European Patent Application No. EP13773028, dated Nov. 13, 2015, 8 pages.
Supplementary European Search Report issued in connection with European Patent Application No. EP13772855, dated Nov. 12, 2015, 8 pages.
Supplementary European Search Report issued in connection with European Patent Application No. EP13772768, dated Nov. 23, 2015, 6 pages.
Supplementary European Search Report issued in connection with European Patent Application No. EP13834717, dated Jun. 6, 2016, 7 pages.
Supplementary European Search Report issued in connection with European Patent Application No. EP13835586, dated Jun. 3, 2016, 7 pages.
First Office Action issued for Chinese patent application No. 201380026486.X, dated Sep. 12, 2016, 11 pages.
First Office Action issued for Chinese patent application No. 201380026495.9, dated Jul. 13, 2016, 21 pages
Office Action issued in connection with European patent application No. 13772768.1, dated Apr. 25, 2018, 6 pages.

* cited by examiner

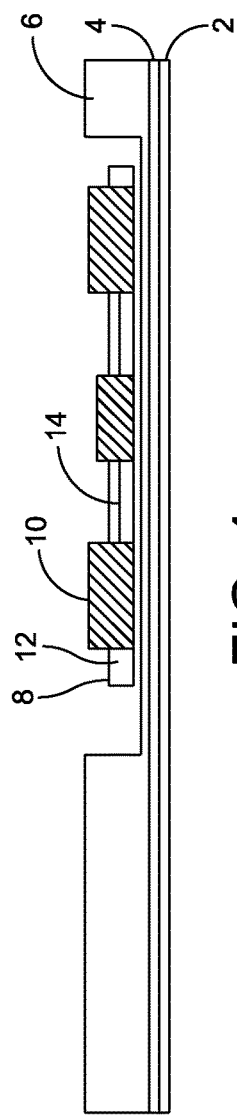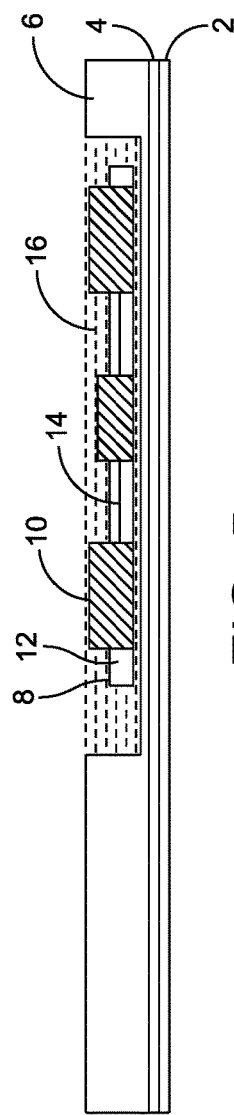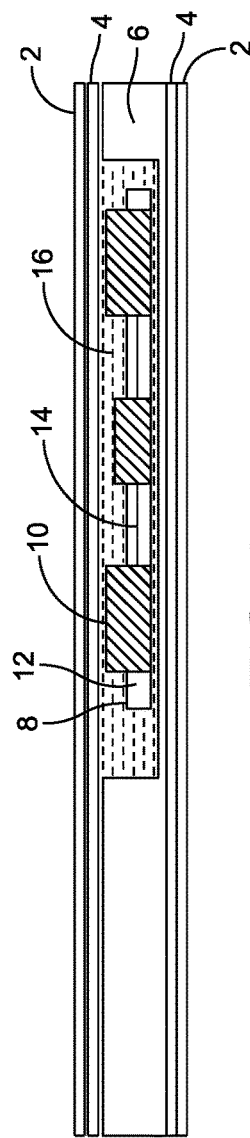

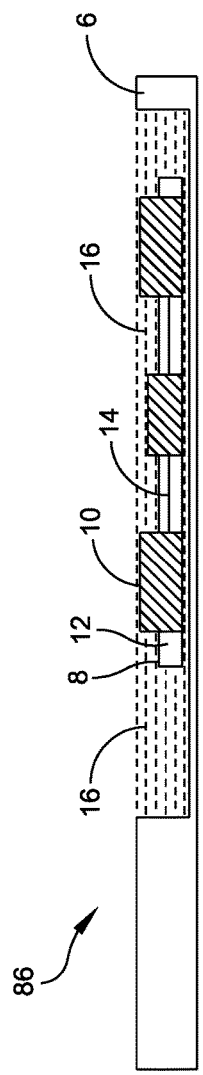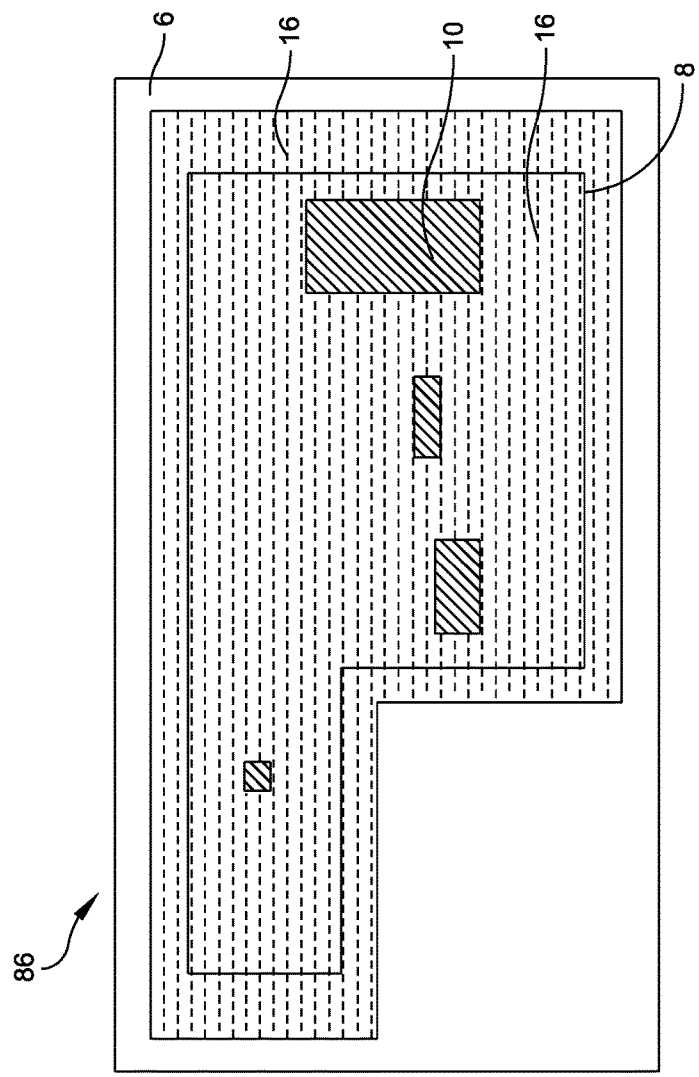

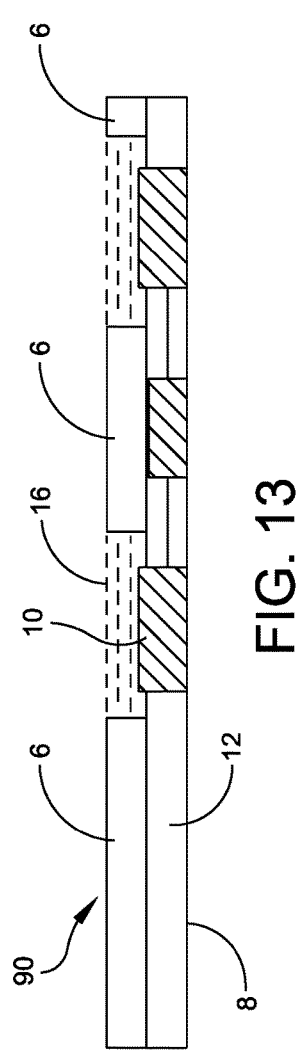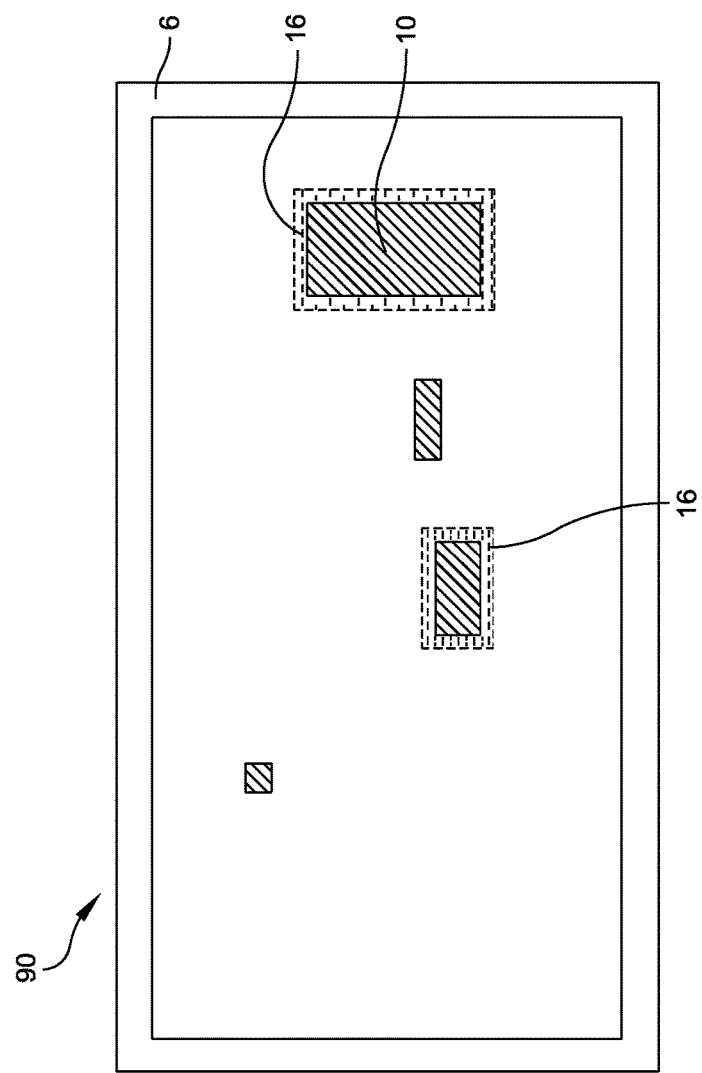

INFORMATION CARRYING CARD COMPRISING A CROSS-LINKED POLYMER COMPOSITION, AND METHOD OF MAKING THE SAME

CROSS-REFERENCE TO RELATED APPLICATIONS

This application is a continuation of U.S. patent application Ser. No. 14/806,272 filed Jul. 22, 2015, which is a continuation of U.S. patent application Ser. No. 13/647,982 filed Oct. 9, 2012 and issued as U.S. Pat. No. 9,122,968, which claims the benefit of U.S. Provisional Application No. 61/619,700 filed on Apr. 3, 2012, which applications are expressly incorporated by reference herein in their entireties.

FIELD OF THE INVENTION

The disclosure relates to information carrying cards such as smart cards. More particularly, the disclosed subject matter relates to a polymer composition, an information carrying card comprising such composition, and a method of making the same.

BACKGROUND OF THE INVENTION

Information carrying cards provide identification, authentication, data storage and application processing. Such cards or parts include key cards, identification cards, telephone cards, credit cards, bankcards, tags, bar code strips, other smart cards and the like. Counterfeiting and information fraud associated with traditional plastic cards causes tens of billions of dollars in the losses each year. As a response, information carrying cards are getting "smarter" to enhance security. Smart card technologies provide solutions to prevent fraud and decrease resulting losses.

Information carrying cards often include an integrated circuit (IC) embedded in a thermoplastic material, such as polyvinyl chloride (PVC). Information has been input and stored in the integrated circuit before a transaction. In use, information carrying cards work in either a "contact" or "contactless" mode. In contact mode, an electronic component on the card is caused to directly contact a card reader or other information receiving device to establish an electromagnetic coupling. In contactless mode, the electromagnetic coupling between the card and the card reading device is established through electromagnetic action at a distance, without the need for physical contact. The process of inputting information into the IC of the information carrying card also works in either of these two modes.

When information carrying cards become "smarter," the amount of information stored in each card often increases, and the complexity of the embedded IC's also increases. The cards also need to withstand flexing to protect sensitive electronic components from damage as well as offer good durability during use. A relatively easy and full-scale commercial process having improved productivity at low cost is also desired.

SUMMARY OF THE INVENTION

The invention provides a cross-linkable polymer composition, a core layer for an information carrying card comprising such cross-linked composition, an information carrying card formed from the core layer for an information carrying card comprising such cross-linked composition, and methods for making the same.

In some embodiments, a cross-linkable polymer composition comprises a curable base polymer resin in a liquid or paste form, and a particulate thermoplastic filler. Such base polymer resin is selected from the group consisting of urethane acrylate, silicone acrylate, epoxy acrylate, acrylate, and urethane. Examples of acrylate include but are not limited to methacrylate. The particulate thermoplastic filler may be polyolefin, polyvinyl chloride (PVC), a compound or blend comprising PVC or a vinyl chloride copolymer, a copolymer of vinyl chloride and at least another monomer, or a polyester such as polyethylene terephthalate (PET). The at least another monomer in the vinyl chloride co-polymer may be vinyl ester, vinyl acetate or vinyl ether in some embodiments. The cross-linkable polymer composition may further comprise at least one curative.

In other embodiments, a cross-linkable polymer composition comprises a curable base polymer resin in a liquid or paste form, and a particulate thermoplastic filler comprising a copolymer of vinyl chloride and at least another monomer. The at least another monomer may be vinyl ester, vinyl acetate or vinyl ether. The curable base polymer is selected from the group consisting of urethane acrylate, ester acrylate, silicone acrylate, epoxy acrylate, acrylate, silicone, urethane and epoxy. Examples of acrylate include but are not limited to methacrylate. Such cross-linkable polymer composition may further comprise at least one curative. Such a composition is transformed into a cross-linked polymer composition after a curing reaction.

In yet other embodiments, a core layer for an information carrying card comprises a cross-linked polymer composition, which comprises a base polymer resin and a particulate thermoplastic filler. Such base polymer resin is selected from the group consisting of urethane acrylate, ester acrylate, silicone acrylate, epoxy acrylate, acrylate, silicone, urethane and epoxy. The particulate thermoplastic filler may be polyolefin, polyvinyl chloride (PVC), a compound or blend comprising PVC or a vinyl chloride copolymer, a copolymer of vinyl chloride and at least another monomer, or a polyester such as polyethylene terephthalate (PET). A core layer for an information carrying card may further comprise an inlay layer having at least one active or passive electronic component, e.g., an integrated circuit (IC). In some embodiments, the cross-linked polymer composition directly contacts the at least one IC on the inlay layer. In additional embodiments, an information carrying card comprises a core layer and a cross-linked polymer composition as described above.

A method for forming a core layer of an information carrying card is provided by the invention. In one embodiment, the method comprises steps of forming a first thermoplastic layer having at least one cavity, disposing an inlay layer of printed circuit board (PCB) partially or fully into the at least one cavity, and dispensing a cross-linkable polymer composition over the inlay layer in the at least one cavity. In some embodiments, the cross-linkable polymer composition used in such a method comprises a curable base polymer resin in a liquid or paste form and a particulate thermoplastic filler. In other embodiments, a method of making a core layer further comprises fixing an inlay layer to a first thermoplastic layer using an instant adhesive. In further embodiments, a method of making a core layer further includes the step of heating the layer structure at a predetermined temperature under pressure.

The invention also provides a method for fabricating an information carrying card comprising forming a core layer of the information carrying card of the invention. The method may further comprise heat laminating a printable thermoplastic film and a transparent thermoplastic film on each side of the core layer of the card.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. In some instances, the dimensions of the various features are arbitrarily expanded or reduced for clarity. Like numerals denote like features throughout the specification and the figures.

FIGS. 1-6 illustrate cross section views of layered structures at different steps in an exemplary process of forming a core layer of an information carrying card, in accordance with some embodiments.

FIG. 1 illustrates a cross section view of a first release film.

FIG. 2 illustrates a cross section view of a second release film disposed over the first release film of FIG. 1.

FIG. 3 illustrates a section view of a first thermoplastic layer having at least one cavity disposed over the two release films of FIG. 2.

FIG. 4 is a cross section view of the layers after an inlay layer is disposed partially or fully inside the cavity of the first thermoplastic layer of FIG. 3.

FIG. 5 is a cross section view of the layers of FIG. 4 after a crosslinkable polymer composition is dispensed over the inlay layer inside the cavity.

FIG. 6 is a cross section view of the resulting layers after placing a third and a forth release film over the layers of FIG. 5.

FIG. 11 is a cross section view of an exemplary core layer of an information carry card having an open inlay cavity close to the size of an inlay, in accordance with some embodiments.

FIG. 12 is a top down view of the exemplary core layer of an information carry card of FIG. 11.

FIG. 13 is a cross section view of an exemplary core layer of an information carry card having a window cavity partially for an inlay, in accordance with some embodiments.

FIG. 14 is a top down view of the exemplary core layer of an information carry card of FIG. 13.

FIG. 15 is a top down view of an exemplary inlay layer, in accordance with some embodiments.

FIG. 16 illustrates a top down view of the exemplary inlay layer of FIG. 15 after cut with holes in its supporting layer.

FIG. 17 illustrates a top down view of the exemplary inlay layer of FIG. 16 disposed over a thermoplastic layer.

FIG. 18 illustrates a top down view of the exemplary inlay layer of FIG. 17 which is fixed onto the thermoplastic layer using instant adhesive, in accordance with some embodiments.

FIG. 20 is a cross section view of a transparent film.

FIG. 21 is a cross section view of a printable film disposed over the transparent film of FIG. 20.

FIG. 22 is a cross section view of the layer structure after an exemplary core layer is disposed over the two films of FIG. 21.

FIG. 23 is a cross section view of the resulting layer structure after a second printable film is disposed over the layer structure of FIG. 22.

FIG. 24 is a cross section view of the resulting layer structure after a second transparent film is disposed over the layer structure of FIG. 23.

DETAILED DESCRIPTION OF PREFERRED EMBODIMENTS

Figure 1:
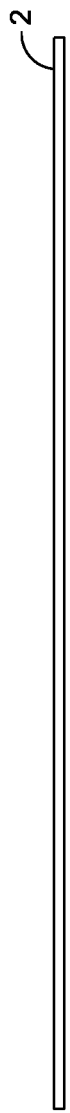

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that any apparatus to be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

For brevity, unless expressly stated otherwise, references to "information carrying card" or "smart card" made throughout this description are intended to encompass at least key cards, identification cards, telephone cards, credit cards, bankcard, power cards, tags, bar code strips, any part comprising an integrated circuit (IC), and the like. "Information carrying card" or "smart card" also includes a wide variety of shapes, which include but are not limited to rectangular sheets, circular sheets, strips, rods and rings. "Information carrying card" or "smart card" also includes any information carrying parts of both "contact" and "contactless" modes. "Information carrying card" or "smart card" also encompasses any information carrying cards with or without an on-board power supply. An information carrying card comprising a power supply is also referred as a "power card."

1. Cross-Linkable Polymer Composition:

A cross-linkable polymer composition formed in accordance with the invention often comprises a curable base polymer resin, in a liquid or paste form, and a particulate thermoplastic filler. The base polymer resin may be selected from the group consisting of urethane acrylate, ester acrylate, silicone acrylate, epoxy acrylate, acrylate and urethane. The acrylate may be a methacrylate. The particulate thermoplastic filler may be polyolefin, polyvinyl chloride (PVC), a copolymer of vinyl chloride and at least another monomer, or a polyester such as polyethylene terephthalate (PET). The particulate thermoplastic filler may be a compound or a blend comprising a thermoplastic resin, for example, a compound or a blend comprising PVC or a vinyl chloride copolymer. The at least another monomer in the vinyl chloride co-polymer may be vinyl ester, vinyl acetate or vinyl ether.

The base polymer resin may be an oligomer or prepolymer having functional groups. The base polymer may be cross-linkable under a regular curing conditions including but not limited to heating, radiation such as ultraviolet (UV) light, moisture and other suitable conditions. The base polymer may be in liquid or paste form. Its viscosity may be in the range of 1-100,000 cps. In some embodiments, the base polymer resin is urethane acrylate. These polymer resins are readily available from specialty chemical suppliers. Examples of these suppliers include but are not limited to Dymax Corporation of Torrington, Conn. and Sartomer USA, LLC of Exton, Pa.

A particulate thermoplastic filler suitable for the invention may be any polymer which, when heated, will melt. Examples of a thermoplastic filler include, but are not limited to polyolefin, PVC, polyester, copolymer, terpolymer and the like. A powdered polymer that provides adequate results may be a compound or a blend comprising PVC, or a modified PVC. One suitable example of the particulate thermoplastic filler comprises a copolymer of vinyl chloride and at least another monomer, which may be vinyl ester, vinyl acetate or vinyl ether. The ratio of vinyl chloride and the least another monomer can be in any ratio. Examples of such a copolymer are available from Dow Chemical Company under trade name of UCAR™, and from BASF of Ludwigshafen, Germany under trade name of Laroflex™. UCAR™ is a copolymer of vinyl chloride and vinyl acetate. The grades include YYNS-3, VYHH and VYHD. Laroflex™ is a copolymer of vinyl chloride and vinyl isobutyl ether. The grades include MP25, MP 35, MP45 and MP60. All of these polymer resins are often supplied in the form of fine powder. One example of a thermoplastic filler is a PVC modified with a copolymer of vinyl chloride and at least another monomer such as vinyl ester, vinyl acetate or vinyl ether. In such an example, the ratio of PVC and the copolymer can be in the range of 99:1 to 1:99, and in the range of 95:5 to 80:20 in some embodiments.

Particulate thermoplastic filler might be obtained through suspension or emulsion polymerization of one or more corresponding monomers or, through pulverization of solid plastics. Pulverization of the solid polymers may be achieved through a mechanical method, a freezing grinding method, a solution method, or any other suitable method. The particulate form can be of any size, by way of example and no limitation; the particles may be in the range of 0.5-200 microns. In some embodiments, the particles are in the range of 1-1000 nm.

The cross-linkable polymer composition may further comprise at least one curative based on general principles of polymer chemistry. In some embodiments, the composition comprises a dual curing mechanism. For example, the cross-linkable composition comprises a first curative for thermal curing and a second curative for radiation curing. During the curing or cross-linking reaction, such a cross-linkable composition transforms into a solid cross-linked polymer composition. Such a cross-linked polymer composition is also known in the art as a "thermosetting" polymer or "thermoset" to distinguish it from a thermoplastic polymer. In some embodiments, the cross-linkable polymer composition comprises a range of from about 20 wt. % to about 99.5 wt. %, and preferably in the range of about 50 wt. % to about 95 wt. %, of the base polymer. The cross-linkable polymer composition often comprises a range of about 0.5 wt. % to about 80 wt. %, and preferably in the range of about 5 wt. % to about 50 wt. %, of the particulate thermoplastic filler. In some embodiments, the cross-linkable polymer composition comprises a range of from about 65 wt. % to about 99.5 wt. %, and preferably in the range of about 80 wt. % to about 95 wt. %, of the base polymer. The cross-linkable polymer composition often comprises a range of about 0.5 wt. % to about 35 wt. %, and preferably in the range of about 5 wt. % to about 20 wt. %, of the particulate thermoplastic filler.

In some embodiments, a cross-linkable polymer composition comprises a curable base polymer resin in a liquid or paste form, and a particulate thermoplastic filler comprising a copolymer of vinyl chloride and at least another monomer. The at least another monomer can be vinyl ester, vinyl acetate or vinyl ether. One example of a thermoplastic filler is a PVC modified with a copolymer of vinyl chloride and at least another monomer such as vinyl ester, vinyl acetate or vinyl ether. The ratio of PVC and the copolymer can be in the range of 99:1 to 1:99, and in the range of 95:5 to 80:20 in some embodiments. The curable base polymer is selected from the group consisting of urethane acrylate, ester acrylate, silicone acrylate, epoxy acrylate, silicone, acrylate, urethane and epoxy. The base polymer resin may be an oligomer or prepolymer having functional groups. The base polymer may be cross-linkable under regular curing conditions including, but not limited to heating, radiation such as ultraviolet (UV) light, moisture and other suitable conditions. The base polymer may be in liquid or paste form. Its viscosity may be in the range of 1-100,000 cps. In some embodiments, functional acrylate such as urethane acrylate is preferred. In other embodiments, the base polymer resin might be epoxy, silicone and urethane. In some embodiments, a formulation for flexibilized or flexible epoxy is preferred over a rigid epoxy. Such polymer resins are readily available from the specialty chemical suppliers.

EXAMPLES

The following examples are only intended to illustrate embodiments in accordance with the invention, and as such should not be construed as limiting the scope of the claims.

The following examples include a thermoplastic filler (Powder 1) and a formulation comprising a base polymer resin. Powder 1 is a fine powder mechanically pulverized from a 14 mil thick poly(vinyl chloride) (PVC) film. One example of a PVC film that provides an adequate Powder 1 is obtained from Klöckner Pentaplast GmbH & Co. KG of Germany under the trade name Pentacard PVC (Vinyl) films, which is a PVC modified with a copolymer of vinyl chloride and vinyl acetate. The powder was sieved with a 1.0-0.05 mm sieve before use. A formulation comprising a base polymer resin is from Dymax Corporation of Torrington, Conn. Examples of such a formulation comprising a base polymer include Multi-cure® 9-20676, 9-20557 and 6-625-SV01. Multi-cure® 9-20676 is visible light or UV-curable urethane acrylate formulation comprising isobornyl acrylate, urethane methacrylate oligomer, acrylate oligomer, 2-(2-ethoxyethoxy) ethyl acrylate, 2-hydroxyethyl methacrylate, acrylic acid, t-butyl perbenzoate and a photoinitiator. Its viscosity is 400 cP, and its boiling point is 205° C.

Multi-cure® 9-20557 is a urethane acrylate or acrylated urethane formulation comprising isobornyl acrylate, urethane methacrylate oligomer, 2-(2-ethoxyethoxy) ethyl acrylate, 2-hydroxyethyl methacrylate, acrylic acid, t-butyl perbenzoate and a photoinitiator. Its viscosity is 2300 cP, and its boiling point is 120° C. It is UV/visible light curable with secondary heat curing feature.

Multi-cure® 6-625-SV01 is a urethane acrylate or acrylated urethane formulation comprising isobornyl acrylate, urethane methacrylate oligomer, 2-hydroxyethyl methacrylate, acrylic acid, maleic acid, t-butyl perbenzoate, a photoinitiator and epoxy resin (<1%). Its viscosity is 10,000 cP. It is UV/visible light curable with secondary heat curing feature.

Exemplary formulations Ex. 1-4 are shown in TABLE 1.

TABLE 1

|  | Ex. 1 | Ex. 2 | Ex. 3 | Ex. 4 |
| --- | --- | --- | --- | --- |
| Multi-cure ® 9-20676 | 85% | 80% |  |  |
| Multi-cure ® 9-20557 |  |  | 85% | 80% |
| Powder 1 | 15% | 20% | 15% | 20% |

The formulations were made by mixing Powder 1 with the corresponding base polymer at the ratio specified in Table 1. The formulation was degased and then placed into a syringe for easy dispensing before use. These formulations (Ex. 1-4) were used in making a core layer for an information carrying card, and the trials were successful. The structure of the core layer of an information carrying card, and the method of making the same are described in detail hereinafter. An inlay layer of a printed circuit board (PCB) is partially or fully disposed into the at least one cavity of a first thermoplastic layer, which was PVC or PVC modified with a vinyl chloride (VC) copolymer in these experiments. One of these cross-linkable polymer compositions (Ext. 1-4) was dispensed over the inlay layer, and then cured at a raised temperature of less than 150° C. under a pressure of less than 2 MPa. The resulting core layer was used in fabricating an information carrying card. In some of these experiments, the information carrying card is a powered smart card.

As comparison, the base polymer Multi-cure® 9-20676 or 9-20557 without any fillers was used in the same way, but the trials were not successful in making an information carrying card.

Exemplary formulations Ex. 5-6 are shown in TABLE 1. Formulations Ex. 5-6 were made using the same method as described. These formulations (Ex. 5-6) were used in making a core layer for an information carrying card, and the trials were successful.

TABLE 2

|  | Ex. 5 | Ex. 6 |
| --- | --- | --- |
| Multi-cure ® 6-625-SV01 | 50% | 20% |
| Powder 1 | 50% | 80% |

2. Core Layer for Information Carrying Card

In some embodiments, a core layer for an information carrying card comprises a cross-linked polymer composition. The cross-linked composition is made through curing the cross-linkable polymer composition described above. Such a cross-linked polymer composition comprises a base polymer resin and a particulate thermoplastic filler. The base polymer resin is urethane acrylate, ester acrylate, silicone acrylate, epoxy acrylate, acrylate, silicone, urethane, epoxy or the like. The particulate thermoplastic filler may be polyolefin, polyvinyl chloride (PVC), a compound or a blend comprising PVC or a vinyl chloride copolymer, a copolymer of vinyl chloride and at least another monomer, or a polyester such as polyethylene terephthalate (PET). The at least another monomer in the vinyl chloride co-polymer may be vinyl ester, vinyl acetate or vinyl ether in some embodiments. One example of the thermoplastic filler is a PVC modified with a copolymer of vinyl chloride and at least another monomer.

The core layer for an information carrying card further comprises an inlay layer having at least one active or passive electronic component, e.g., an integrated circuit (IC). In some embodiments, the inlay layer may comprise a piece of metal, ceramic or plastics. In some embodiments, the cross-linked polymer composition directly contacts at least one IC on the inlay layer. The core layer for an information carrying card further comprises at least one thermoplastic layer having at least one cavity. The inlay layer having at least one integrated IC is partially or fully disposed inside the cavity over the at least one thermoplastic layer. The crosslinked polymer composition is disposed into the cavity over the at least one thermoplastic layer, directly contacting the at least one active or passive electronic component, e.g., an integrated circuit (IC) on the inlay layer. This invention also provides a method for forming such a core layer of an information carrying card.

Figure 2:
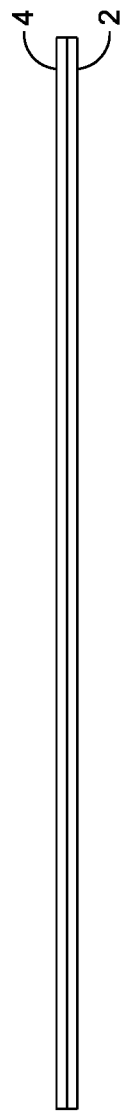

Referring to FIGS. 1 and 2, first release film 2 may be a sheet of polytetrafluoroethylene under the trade name Teflon®, any other fluoropolymer, silicone, a fluoropolymer or silicone coated films. A second release film 4 is disposed over first release film 2. Second release film 4 can be formed from the same material and process as first release film 2. In some embodiments, a breathable release film is preferred. Examples of a breathable release film as second release film 4 is a silicone coated paper. For example, second release film 4 may take the form of a silicone coated, unbleached parchment baking paper, available from Regency Wraps company under the trade name of "If you care."

Figure 3:

Referring to FIG. 3, a first thermoplastic layer 6 has at least one cavity 7, which is disposed over release films 2 and 4. Examples of materials that are suitable for use in forming first thermoplastic layer 6 include polyvinyl chloride (PVC), a copolymer of vinyl chloride, polyolefin, polycarbonate, polyester, polyamide, acrylonitrile butadiene styrene copolymer (ABS), and the like. First thermoplastic layer 6 may be a PVC, a copolymer of vinyl chloride and another monomer such as vinyl ether, vinyl ester or vinyl acetate, or a PVC modified with a vinyl chloride copolymer. Examples of PVC films suitable for use with the invention are available from suppliers such as Klockner Pentaplast of America, Inc. of Gordonsville, Va.; and Shijiazhuang Eurochem Co. Ltd of China. Examples of such a vinyl chloride copolymer resin are available from Dow Chemical Company under trade name of UCAR®, and from BASF of Ludwigshafen, Germany under trade name of Laroflex®. UCAR® is a copolymer of vinyl chloride and vinyl acetate. The grades include YYNS-3, VYHH and VYHD. Laroflex® is a copolymer of vinyl chloride and vinyl isobutyl ether. The grades include MP25, MP 35, MP45 and MP60. All of these polymer resins may be supplied as fine powder. A powder of these copolymers can be added to modify PVC resins for films. First thermoplastic layer 6 having at least one cavity can be formed by die-cutting one or more thermoplastic film and then laminating and heating one or more thermoplastic films. For example, a 0.35 micron thick film is die-cut to have at least one holes, and then laminated onto a 0.025 micron thick film to form a first thermoplastic layer 6 having at least one cavity.

Referring to FIG. 4 an inlay layer 8 may be disposed partially or fully inside cavity 7 of first thermoplastic layer 6. Inlay layer 8 comprises at least one printed circuit board (PCB) having at least one active or passive electronic component 10 embedded or surface-mounted on a supporting film 12. Examples of supporting film 12 include but are not limited to polyimide, polyester such as PET, glass filled epoxy sheet such as FR-4. A printed circuit board (PCB) having all the components are abbreviated as PCBa. For brevity, the references to PCB in this disclosure will be understood to encompass any PCBs including PCBa. Examples of electronic component 10 inside inlay layer 8 include but are not limited to active or passive electronic components, e.g., an integrated circuit (IC), a battery for a "power card," an antenna, and a functional component such as light emitting diodes (LED). Electronic components are interconnected via wires or traces 14. Supporting film 12 may be a polymer based dielectric material. In some embodiments, inlay layer 8 may comprise a piece of metal, ceramic or plastics. For example, a piece of metal or ceramic may comprise platinum, copper, tungsten, metal powders, ceramic, or ceramic powders. Inlay layer 8 may have any dimension relative to the size of a cavity in first thermoplastic layer 6. Inlay layer 8 may be partially or fully disposed in such a cavity. In some embodiments, the size of the cavity on first thermoplastic layer 6 is larger than the size of inlay layer 8. Inlay layer 8 may be fully disposed in the cavity. In some embodiments, the size of the cavity in first thermoplastic layer 6 is the same as or slightly larger than the size of inlay layer 6 of PCB. The shape of the cavity often matches with the shape of inlay layer 8. In some embodiments, the size of the at least one cavity on first thermoplastic layer 6 is less than the size of inlay layer 8. The size of the at least one cavity is the same as or slightly larger than a portion of inlay layer 8 of the PCB. For example, the shape and size of one cavity may match with one electronic component 10. Examples of electronic component 10 include but are not limited to a battery or an active or passive electronic component, e.g., an integrated circuit (IC) in inlay layer 8.

Referring to FIG. 5, the resulting layer, after a cross-linkable polymer composition 16, is dispensed over the inlay layer inside the cavity. The cross-linkable polymer composition 16 comprises a curable base polymer resin in a liquid or paste form, and a particulate thermoplastic filler. Such a base polymer resin may be urethane acrylate, silicone acrylate, epoxy acrylate, acrylate, urethane, epoxy or silicone. The particulate thermoplastic filler may be polyolefin, polyvinyl chloride (PVC), a copolymer of vinyl chloride and at least another monomer, or a polyester such as polyethylene terephthalate (PET). The at least another monomer in the vinyl chloride co-polymer filler may be vinyl ester, vinyl acetate or vinyl ether in some embodiments. The particulate thermoplastic filler may be a compound or a blend comprising a thermoplastics such as PVC or a PVC copolymer. One example of the thermoplastic filler is a PVC modified with a copolymer of vinyl chloride and at least another monomer. Cross-linkable polymer composition 16 may further comprise at least one curative. Such a cross-linkable polymer composition 16 becomes a solid cross-linked composition after curing. Preferably, such a cross-linked composition is more flexible than the first thermoplastic layer 6 in some embodiments.

Cross-linkable polymer composition 16, which is packed in a syringe, can be dispensed using the standard dispensing apparatus or equipment for adhesives, encapsulants, sealants and potting compounds. The amount to cross-linkable composition 16 to be dispensed can be calculated and controlled based on the volume of the cavity and the inlay layer 8.

Referring to FIG. 6, the resulting layers after placing a third and a forth release film over the layers shown in FIG. 5, form a sandwich structure. The third and fourth release films can be any kind of release films, and in some embodiments, second and third release films 4 are formed of the same material. The first and fourth release films 2 are may also be formed from the same materials. For example, in some embodiments, the second and third release films 2 may be formed from a breathable silicone coated paper. The first and fourth release films 4 are often formed from a fluoropolymer such as polytetrafluoroethylene often offered under a trade name of Teflon®. The resulting sandwich or layered structure of FIG. 6 is placed under pressure and heated to form a core layer for an information carrying card, as illustrated in the exemplary process of FIG. 7.

Figure 7:
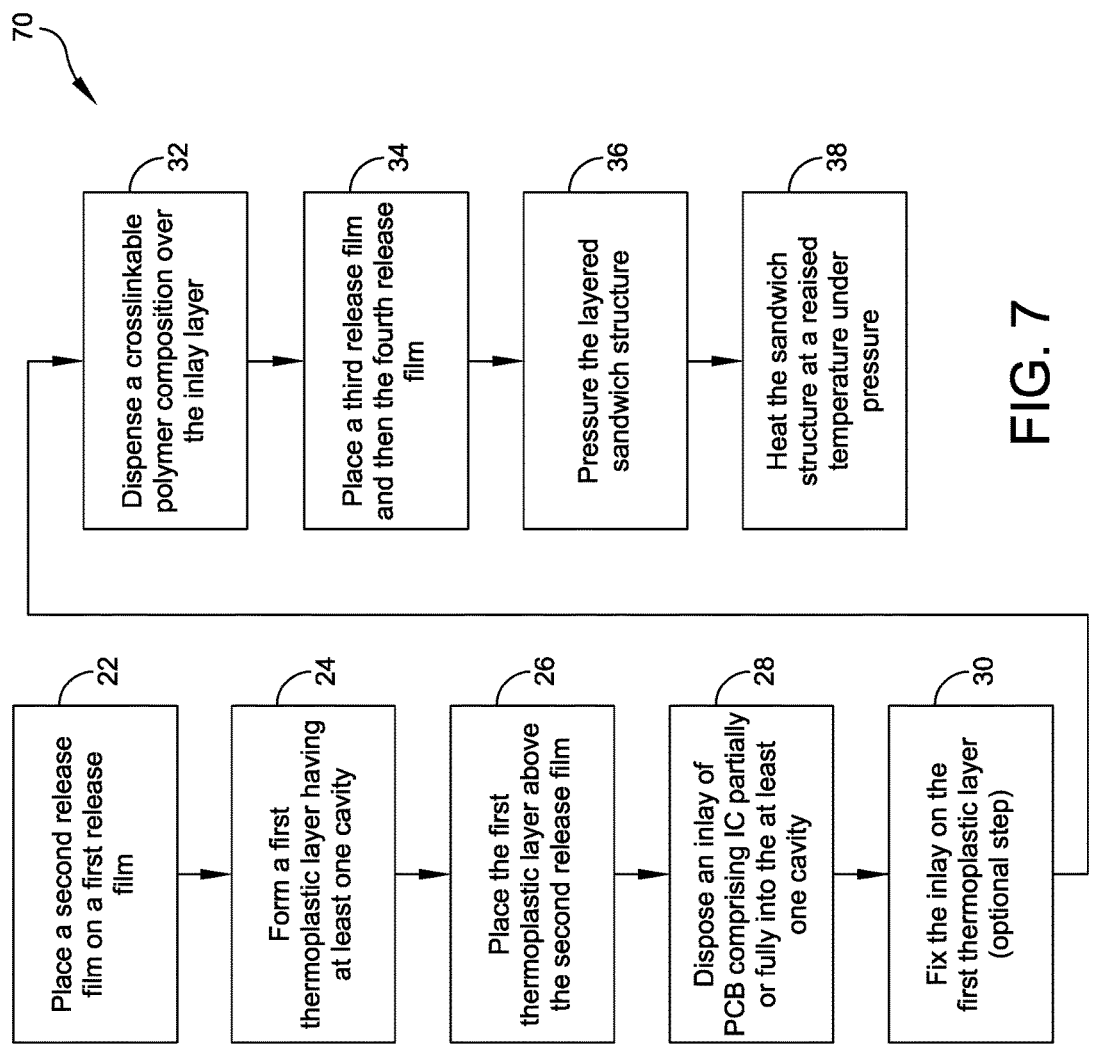
FIG. 7 is a flow chart diagram illustrating an exemplary process of forming a core layer of an information carrying card, in accordance with some embodiments.

Referring to FIG. 7, a process 70 forming a core layer of an information carrying card, in accordance with some embodiments includes the following steps. At step 22, a second release film 4 is placed above a first release film 2. At step 24, a first thermoplastic layer 6 having at least one cavity is formed. In some embodiments, the first thermoplastic layer 6 is formed through steps of die-cutting one or more thermoplastic films; and then hot laminating with one or more uncut thermoplastic films. At step 26, first thermoplastic layer 6, having at least one cavity, is placed above first and second release film (4 and 6). At step 28, an inlay layer 8 having printed circuit board (PCB) is placed at least partially into the at least one cavity on first thermoplastic layer 6. In some embodiments, the size of the at least one cavity on first thermoplastic layer 6 is larger than the size of the inlay layer 8 of the PCB. In some embodiments, the size of the at least one cavity on first thermoplastic layer 6 is substantially the same as the size of the inlay layer 8 of PCB. In other embodiments, the size of the at least one cavity on first thermoplastic layer 6 is substantially the same as the size of a portion of the inlay layer 8 of PCB.

Following step 28, the process optionally comprises step 30 of "fixing" inlay layer 8 on first thermoplastic layer 6 using an instant adhesive. A plurality of holes is formed on the inlay layer by cutting some portions of supporting film 12 without any electronic component 10 and interconnects 14. An instant adhesive is applied to the holes after step 28. Examples of an instant adhesive include but are not limited to cyanoacrylate. In some embodiments, inlay layer 8 is fixed to first thermoplastic layer 6 in a period as short as a few seconds.

At step 32 (FIG. 7) a cross-linkable polymer composition 16 is dispensed over inlay layer 8 and inside the cavity. The cross-linkable polymer composition may directly contact the electronic components 10 including active or passive electronic components, e.g., an integrated circuit (IC). The amount of cross-linkable polymer composition is predetermined and controlled. Any extra material exceeding the top surface of first thermoplastic layer 6 may be removed. In some embodiments, the curable base polymer resin in the cross-linkable polymer composition is urethane acrylate, and the particulate thermoplastic filler in the cross-linkable polymer composition is PVC, a compound or a blend comprising PVC or a vinyl chloride copolymer, or a copolymer of vinyl chloride and at least another monomer such as vinyl ester or vinyl ether.

At step 34, third release film and fourth release film 4 are placed on the layered structure to form a sandwich structure (FIG. 6). The third release film is placed first followed by the fourth release film. In some embodiments, the third release film is formed from the same material as the second release film 4, which is preferably a breathable release film. The fourth release film may be formed from the same material as first release film 2. In some embodiments, the first and fourth release films are a polytetrafluoroethylene (under the trade name Teflon®) sheet. At step 36, the layered structure above is placed under pressure, e.g., a pressure of less than about 2 MPa.

At step 38, the layered structure is heated under pressure. A suitable temperature would be one that is sufficiently high to partially or fully cure the cross-linkable polymer composition 16, or hot laminating first thermoplastic film 6, or both. After the heat treatment, the cross-linkable polymer composition 16 forms a solid. Such a cross-linked polymer composition has good adhesion with first thermoplastic layer 6 and inlay layer 8 including electronic component 10 and supporting film 12. In some embodiments, such a cross-linked composition is more flexible than first thermoplastic film 6. In some embodiments, the temperature is in the range of 65-232° C. In some embodiments, the temperature is less than 150° C.

Process 70 may further comprise cooling the layer structure and peeling off the first, second, third and fourth release films. Process 70 may further comprise a step of curing the cross-linkable polymer composition 16 using visible light, UV or other radiation curing. It may also comprise a step of curing via the introduction of moisture or the promotion of other chemical reactions. After process 70, the cross-linkable polymer composition 16 is cured so as to yield a solid. After the release films are peeled away, a core layer for an information carrying card is formed. The core layer comprises a first thermoplastic layer 6, an inlay layer 8 and a cross-linked polymer composition 16. The exemplary core layers for an information carrying card from process 70 are shown in FIG. 8-14.

Figure 8:
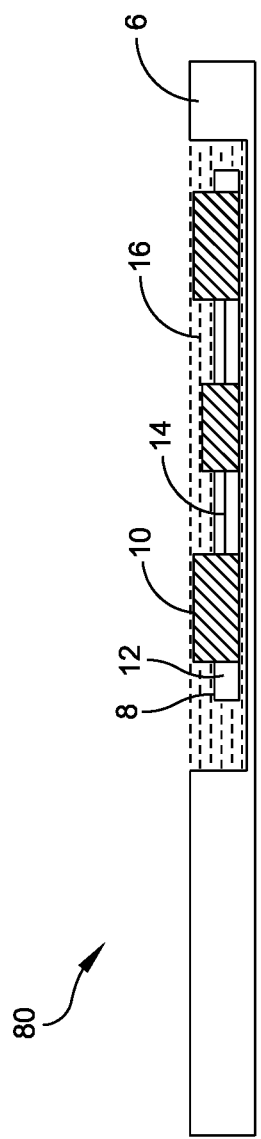
FIG. 8 is a cross section view of an exemplary core layer of an information carry card, which is fabricated according to the structure in FIG. 1-6 and steps in FIG. 7.

Referring to FIG. 8, an exemplary core layer 80 of an information carry card, is fabricated according to the structure depicted FIG. 1-6 and steps of FIG. 7. More particularly, the exemplar core layer 80 comprises a first thermoplastic layer 6, an inlay layer 8, and a cross-linked polymer composition 16. First thermoplastic layer 6 is polyvinyl chloride (PVC), a copolymer of vinyl chloride, polyolefin, polycarbonate, polyester, polyamide, acrylonitrile butadiene styrene copolymer (ABS), or the like. Cross-linked polymer composition 16 is formed from a cross-linkable composition as described in related sections above. Inlay layer 8 comprises electronic components 10, for example, at least one printed circuit board (PCB), supporting film 12 and interconnects 14. The electronic components, such as a battery and an active or passive electronic components 10, are connected with interconnects 14. Electronic components 10 are embedded on supporting film 14. The cross-linked polymer composition fills the voids and remaining spaces inside the cavity on first thermoplastic layer 6 and inlay layer 8. In some embodiments, the cross-linked polymer composition directly contacts the outer surface of electronic components 10. Referring once again to FIG. 4, inlay layer 8 may have any dimension relative to the size of a cavity in the first thermoplastic layer 6. Inlay layer 8 may be partially or fully disposed into such a cavity.

Figure 9:
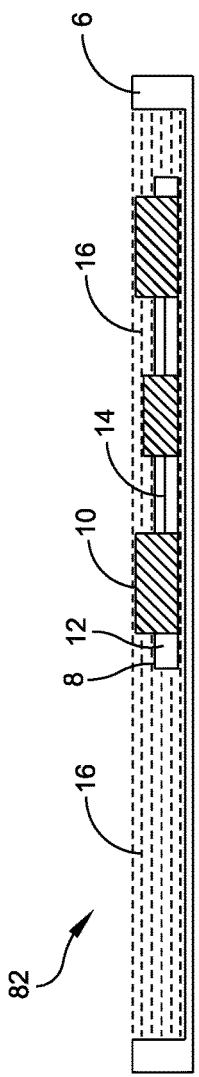
FIG. 9 is a cross section view of an exemplary core layer of an information carry card having a full open cavity for an inlay, in accordance with some embodiments.
Figure 10:
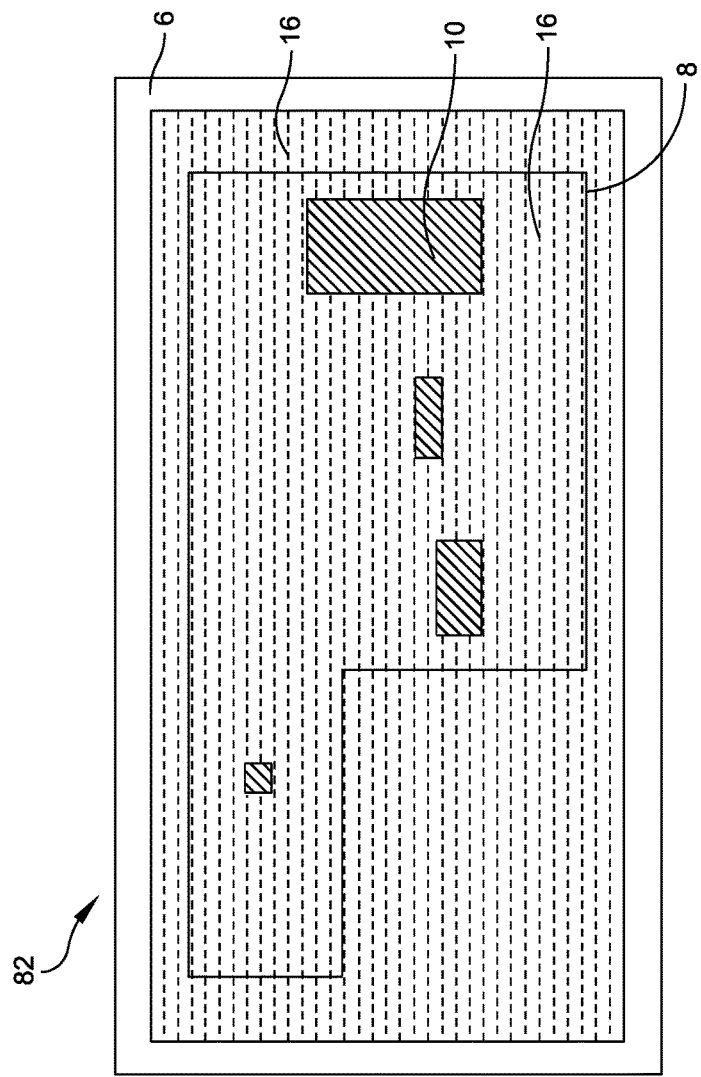
FIG. 10 is a top down view of the exemplary core layer of an information carry card of FIG. 9.

Referring to FIGS. 9-14, different configurations of core layers for an information carrying card may also be utilized with good effect. Referring to FIG. 9, an exemplary core layer 82 of an information carry card includes a full open cavity for an inlay. In FIGS. 9 and 10, the size of a cavity on the first thermoplastic layer 6 is larger than the size of inlay layer 8. In some embodiments, such a cavity is close to but slightly smaller than the size of an information carrying card. Inlay layer 8 is fully disposed into the cavity. The shape of the cavity may not be the same as the shape of inlay layer 8.

Referring FIGS. 11 and 12, an exemplary core layer 86 of an information carry card includes an open inlay cavity close to the size of an inlay layer 8. In FIGS. 11 and 12, the size of a cavity on the first thermoplastic layer 6 is the same as or slightly larger than the size of inlay layer 8. The shape of the cavity matches with the shape of inlay layer 8. In this configuration, inlay layer 8 can be fully disposed inside the cavity on the first thermoplastic layer 6. The gap between the edge of the first thermoplastic layer 6 and inlay layer 8 might be smaller than the gap shown in FIGS. 9 and 10.

Referring to FIGS. 13 and 14, an exemplary core layer 90 of an information carry card includes a window cavity partially for an inlay. In FIGS. 13 and 14, the size of the at least one cavity on the first thermoplastic layer 6 is less than the size of inlay layer 8. The size of the at least one cavity is the same as or slightly larger than a portion of inlay layer 8. In some embodiments, a portion of inlay layer is cut open for form one or more holes so that an electronic component 10 can be fit into one of the holes. Examples of such an electronic component 10 include but are not limited to a battery or a chip in the inlay layer 8. In some embodiments, the electronic component 10 in inlay layer 8 is inserted from one side of the first thermoplastic layer 6. During the fabrication process, a crosslinkable composition for the crosslinked polymer composition 16 can be applied to from the other side of the first thermoplastic layer 6.

Figure 15:
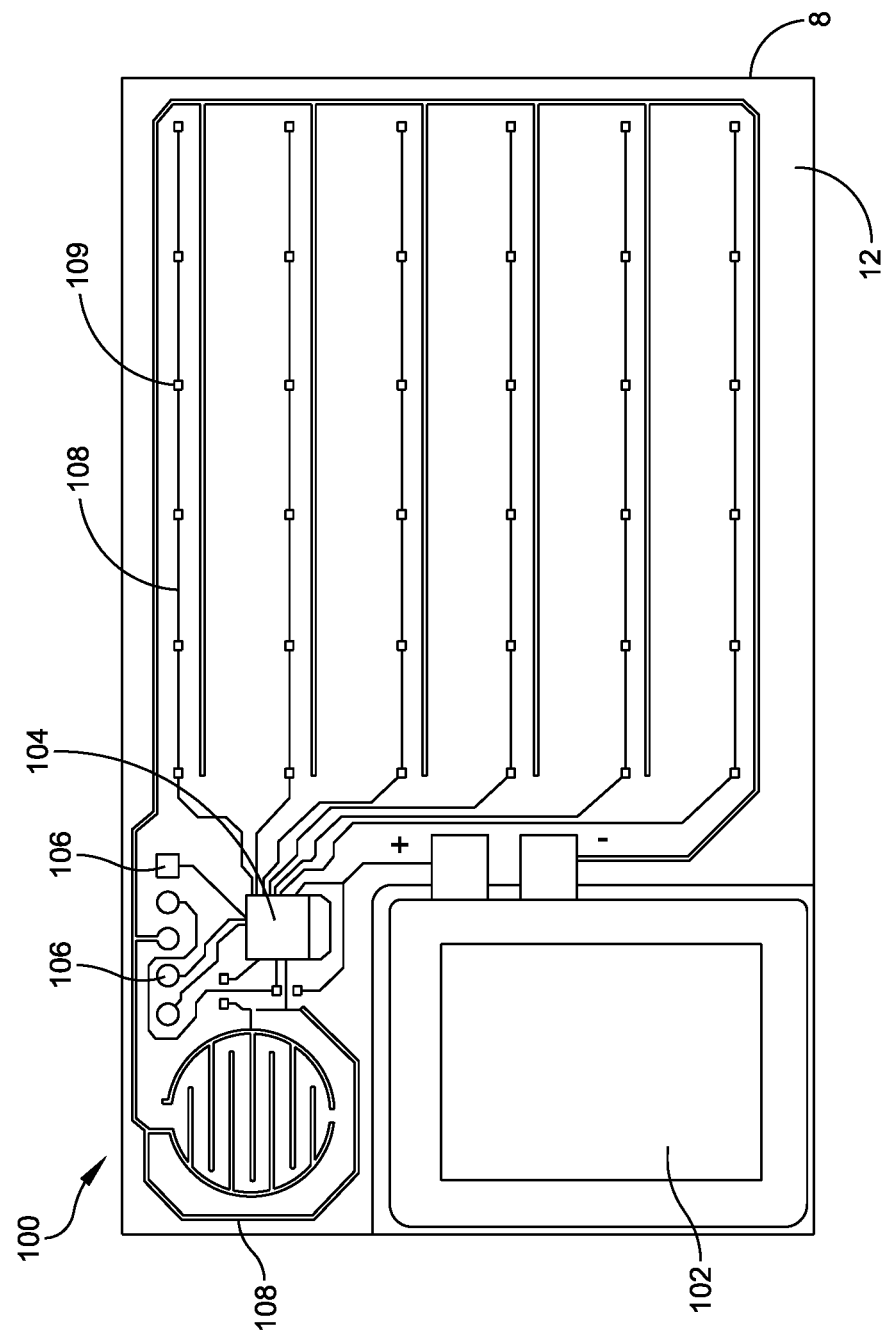
FIGS. 15-18 illustrate an exemplary process for fixing an exemplary inlay layer onto a thermoplastic layer using an instant adhesive, in accordance with some embodiments.
Figure 17:
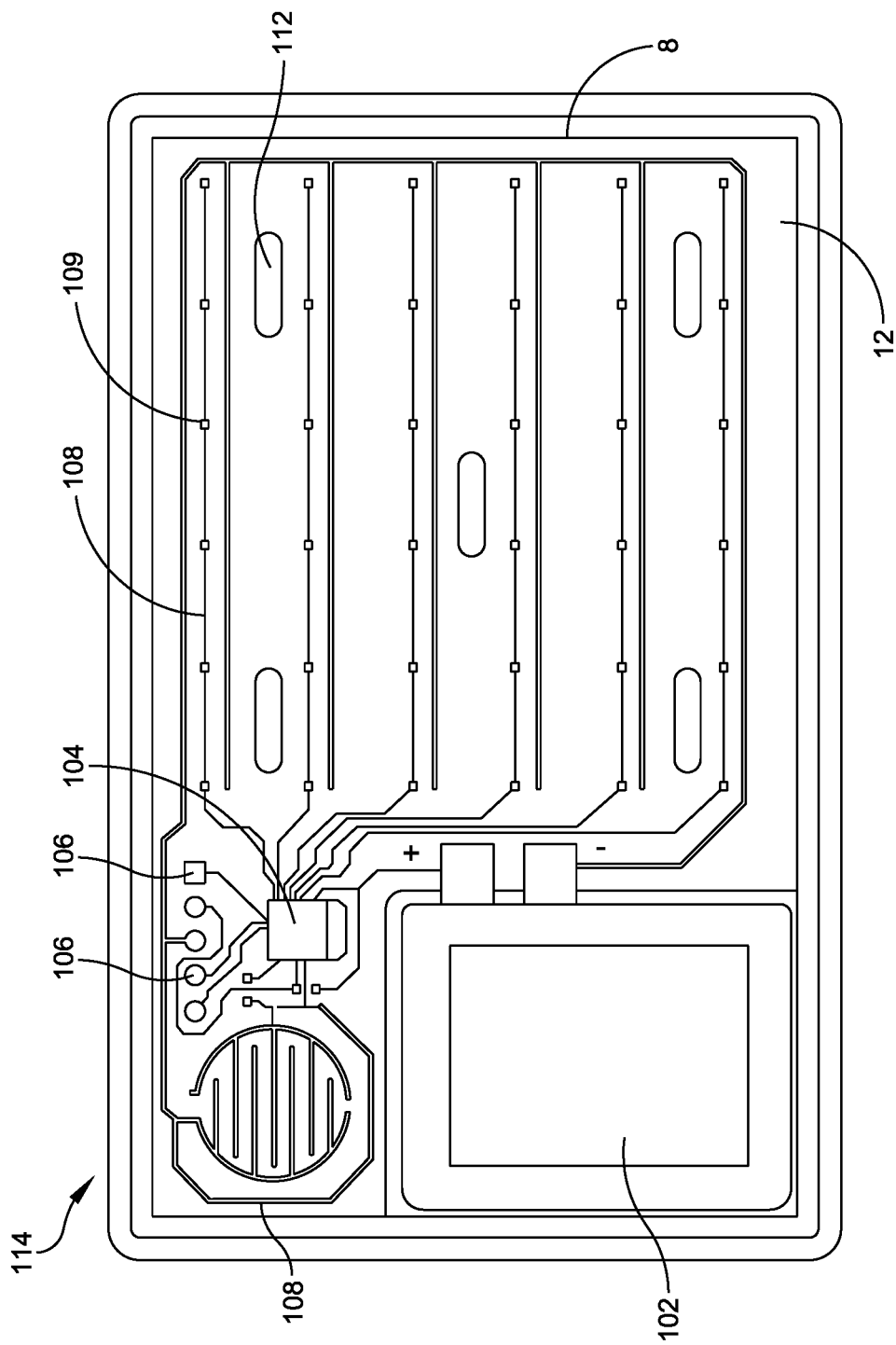
Figure 18:
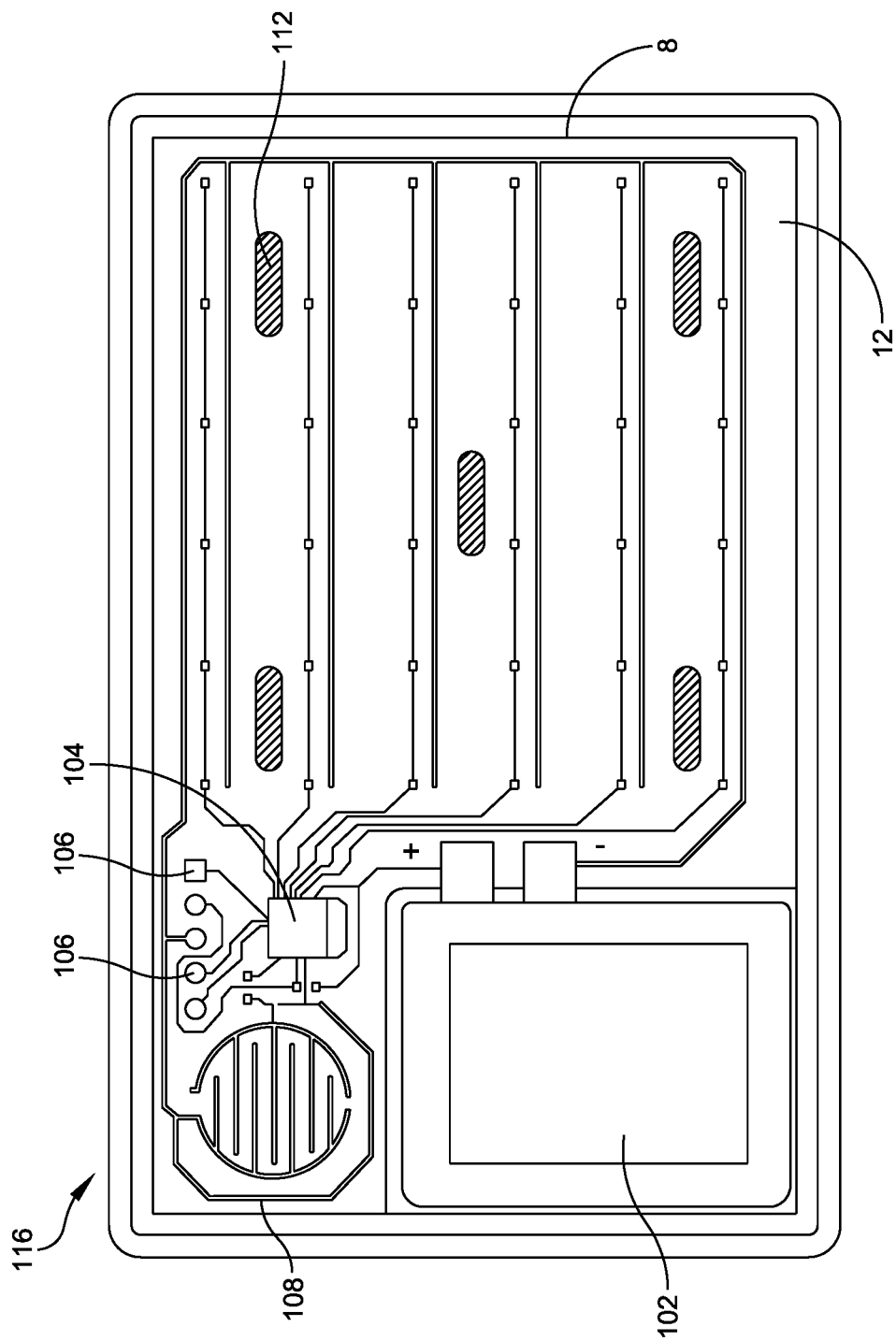
Figure 19:
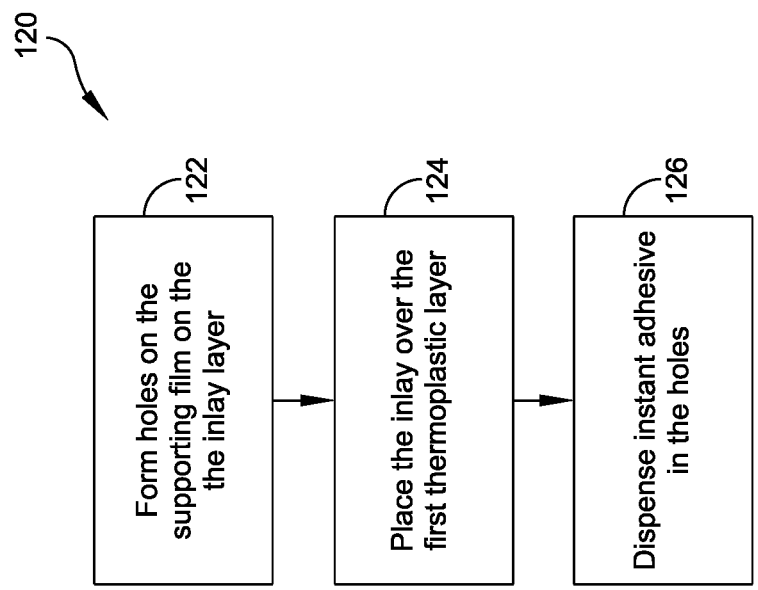
FIG. 19 is a flow chart diagram illustrating an exemplary process of fixing an inlay layer onto a thermoplastic layer, in accordance with some embodiments.

Referring to FIGS. 15-19, an exemplary process 120 fixing an exemplary inlay layer 8 onto a thermoplastic layer 6 using an instant adhesive, in accordance with some embodiments, includes the following steps listed in FIG. 19. An inlay layer is first provided. Referring to FIG. 15, an exemplary inlay layer 8 is used as a model for demonstration purpose. The electronic components used for a core layer of an information carrying card are not limited to the components illustrated in FIG. 15. Inlay layer 8 comprises a supporting film 12, a battery 102, a chip 104 having at least one integrated circuit (IC), metal structures 106, metal interconnect wires 108, and functional components such as LED 109. Supporting film 12 is a polymer based dielectric material in some embodiments. This inlay layer is suitable for a "power card."

Figure 16:
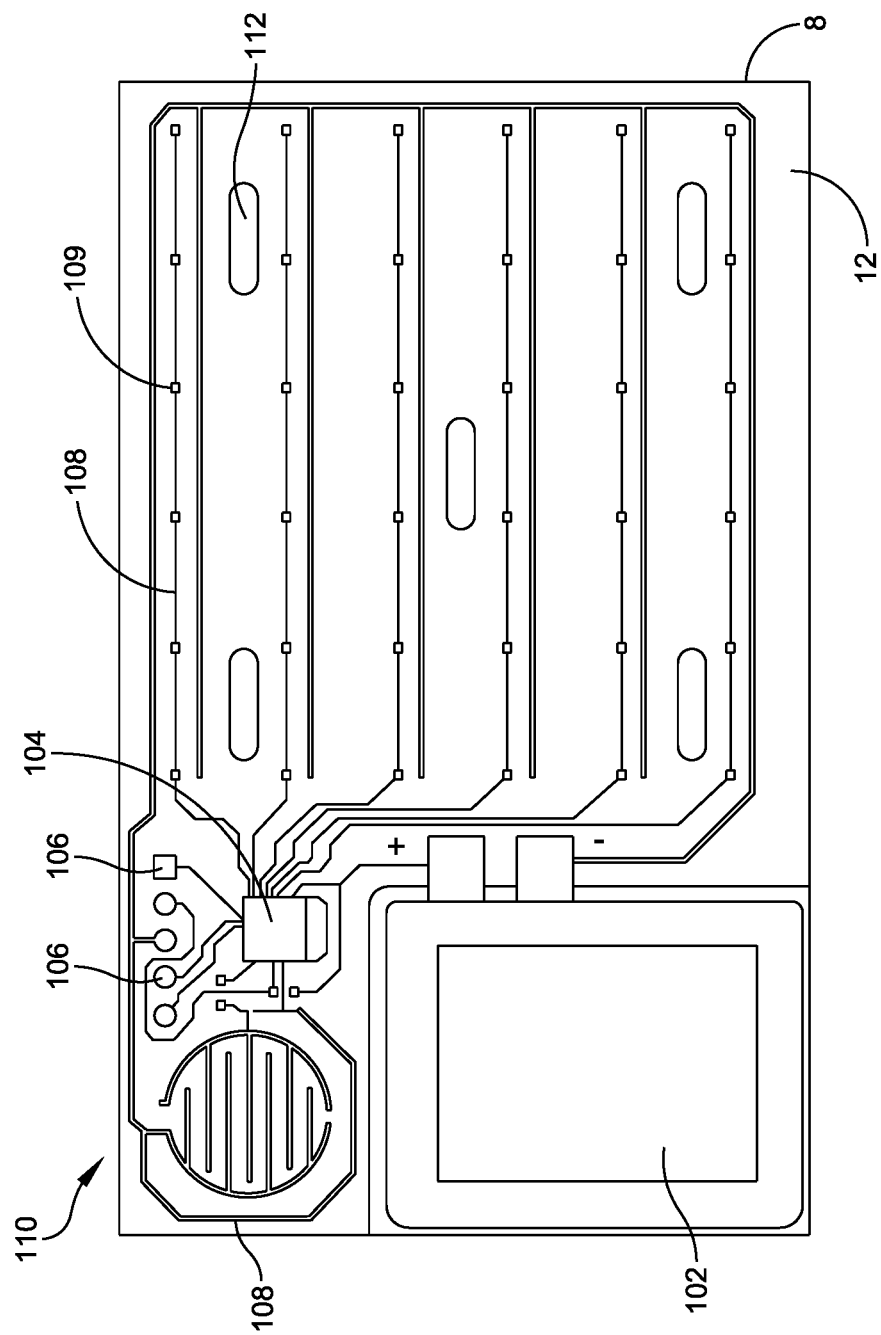

In step 122 (FIG. 19), a plurality of holes are formed by cutting the inlay layer 8 on the portions of the supporting film 12 without any electronic components and interconnect wires. Referring to FIG. 16, the exemplary inlay layer 8 includes a plurality of holes 112 in its supporting layer 12 after cut. The holes can be of any shape and any size.

Examples of the shape of the holes include but are not limited to circle, rectangle, square or any other shape.

In step 124, the resulting inlay layer 8 having holes is placed partially or fully inside a cavity of the first thermoplastic layer 6. The exemplary inlay layer 8 may have any dimension relative to size of a cavity in the first thermoplastic layer 6. The exemplary inlay layer 8 may be partially or fully disposed into such a cavity. Referring to FIG. 17, the exemplary inlay layer 8 having a plurality of holes is disposed over a first thermoplastic layer 6 having an open inlay cavity. The exemplary first thermoplastic layer has a cavity bigger than the inlay layer so that the inlay layer is fully disposed into the cavity on the first thermoplastic layer 6.

In step 126 of FIG. 7, a small amount of an instant adhesive is applied into each hole 112. Referring to FIG. 18, the exemplary inlay layer 8 is fixed onto the thermoplastic layer 6 using an instant adhesive 115 form the resulting structure 116, in accordance with some embodiments. Examples of an instant adhesive 115 include but are not limited to cyanoacrylate. In some embodiments, the instant adhesive 115 cures fast in a few seconds. Such a fixing process used in this disclosure is understood to encompass any process of fixing an inlay layer 8 onto the first thermoplastic layer 6 using any other adhesive.

3. Information Carrying Cards

In some embodiments, an information carrying card comprises a core layer and a crosslinked polymer composition described above. In some embodiments, the information carrying card further comprises at least one printable thermoplastic film laminated onto the surface of the at least one thermoplastic layer and the crosslinked polymer composition. The information carrying card further comprises at least one transparent film laminated onto the surface of the printable thermoplastic film. In some embodiments, the information carrying card comprises at least one battery interconnected with the at least one integrated circuit (IC) on an inlay layer in the core layer. The information carrying card may also comprise a piece of metal, ceramic or plastic materials in the core layer of some information carrying cards.

In some embodiments, the invention also provides a method for fabricating an information carrying card. The method comprises forming a core layer of the information carrying card in this disclosure. The method may further comprise heat laminating a printable thermoplastic film and a transparent thermoplastic film on each side of the core layer of the information.

Figure 20:
FIGS. 20-24 illustrate cross section views of the layer structure at different steps of an exemplary process of making an exemplary information carrying card, in accordance with some embodiments.
Figure 21:
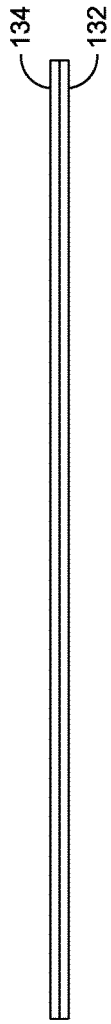
Figure 23:
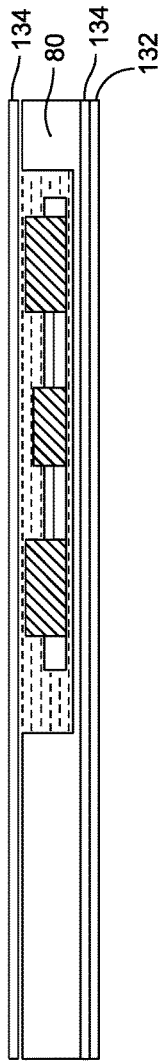
Figure 24:
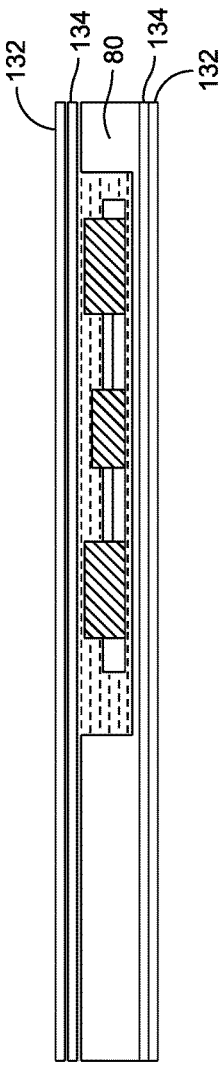
Figure 25:
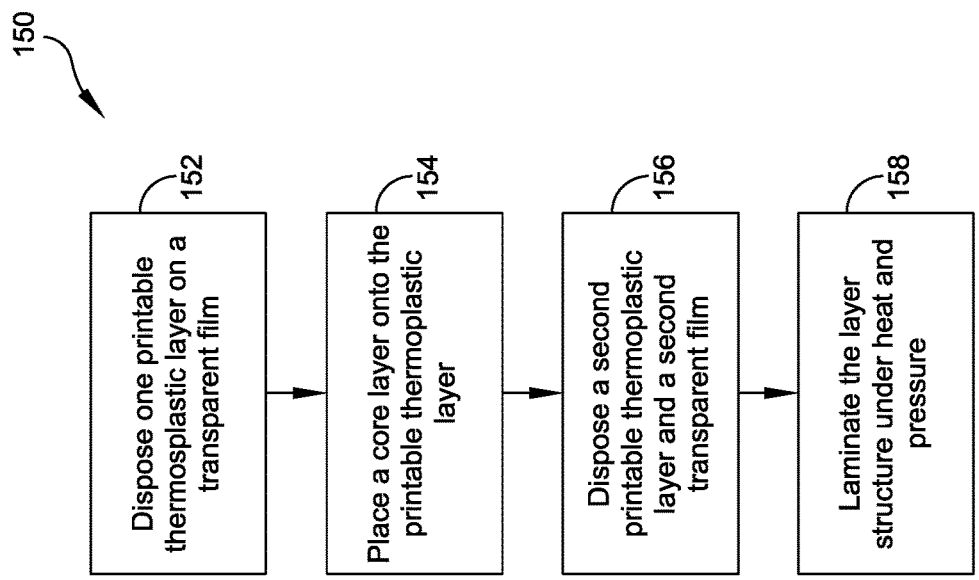
FIG. 25 is a flow chart diagram illustrating an exemplary process of making an exemplary information carrying card.

Referring to FIGS. 20-25, an exemplary process 150 of making an exemplary information carrying card includes the following steps as shown in FIG. 25. The layer structure at different steps of an exemplary process 150 is shown in FIGS. 20-24. Referring to FIG. 20, a transparent film 132 is provided first. A transparent film 132 can be used as the outer layer of an information carrying card. Examples of transparent film 132 include but are not limited to PVC, modified PVC and PET. In step 152 of FIG. 25, referring to the structure shown in FIG. 21, a printable thermoplastic film layer 134 is disposed onto the transparent film 132. The printable thermoplastic film 134 is an imaging receiving layer. Words or images can be printed onto the printable thermoplastic film 134 before or during a process of making an information card. In some embodiments, this film is not transparent, and contains some pigments such as white pigments.

Figure 22:
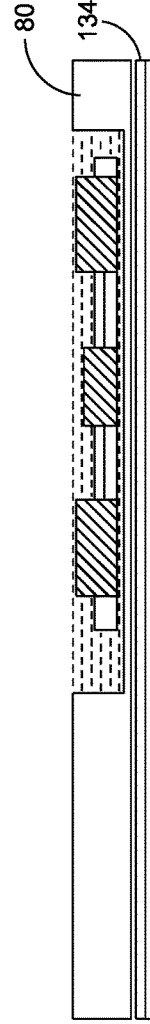

In step 154 of FIG. 25, a core layer 80 is disposed onto the printable thermoplastic layer 134 and the transparent film 132. One example of resulting layer structure is shown in FIG. 22. Referring again to FIG. 8, in some embodiments, an exemplary core layer 80 comprises a first thermoplastic layer 6, an inlay layer 8, and a cross-linked polymer composition 16. Inlay layer 8 comprises electronic components 10, for example, at least one printed circuit board (PCB), supporting film 12 and interconnects 14. The electronic components, such as a battery and an active or passive electronic components 10, are connected with interconnects 14. Electronic components 10 are embedded on supporting film 14. Cross-linked polymer composition 16 fills the voids and remaining spaces inside the cavity on first thermoplastic layer 6 and inlay layer 8. In some embodiments, cross-linked polymer composition 16 directly contacts the outer surface of electronic components 10.

In step 156 (FIG. 25), a second printable thermoplastic layer 134 is disposed onto the layered structure of FIG. 22, followed by a second transparent film 132. The exemplary resulting layer structures are shown in FIG. 23 and FIG. 24. In some embodiments, at least one release film is used on each side of the layer structure of FIG. 24. Referring to FIGS. 1 and 2, examples of the release film include a sheet of polytetrafluoroethylene, any other fluoropolymer, silicone, a fluoropolymer or silicone coated films. In some embodiments, a breathable release film is used.

In step 158 (FIG. 25), the exemplary layer structure after step 156 is laminated under a pressure at a raised temperature. The layered structure after step 156 is pressed under a pressure. In some embodiments, the pressure is less than 2 MPa. The layered sandwich structure is then heated at a raised temperature under the pressure. A suitable temperature is sufficiently high so that all the films are laminated with good adhesion. In some embodiments, the temperature is in the range of 65-232° C. In some embodiments, the temperature is less than 150° C. The information carrying card may have different sizes. In some embodiments, the information card may have a size following ISO/IEC 7810 standard. For example, an ID-1 type smart card, which is for most of the banking card and ID cards, has a size of 85.6×53.98 mm.

In some embodiments, the exemplary process 150 comprises a process such as surface treatment to improve adhesion between two layers. Examples of surface treatment methods include but are not limited to plasma treatment or corona treatment before hot lamination at step 158.

Figure 26:
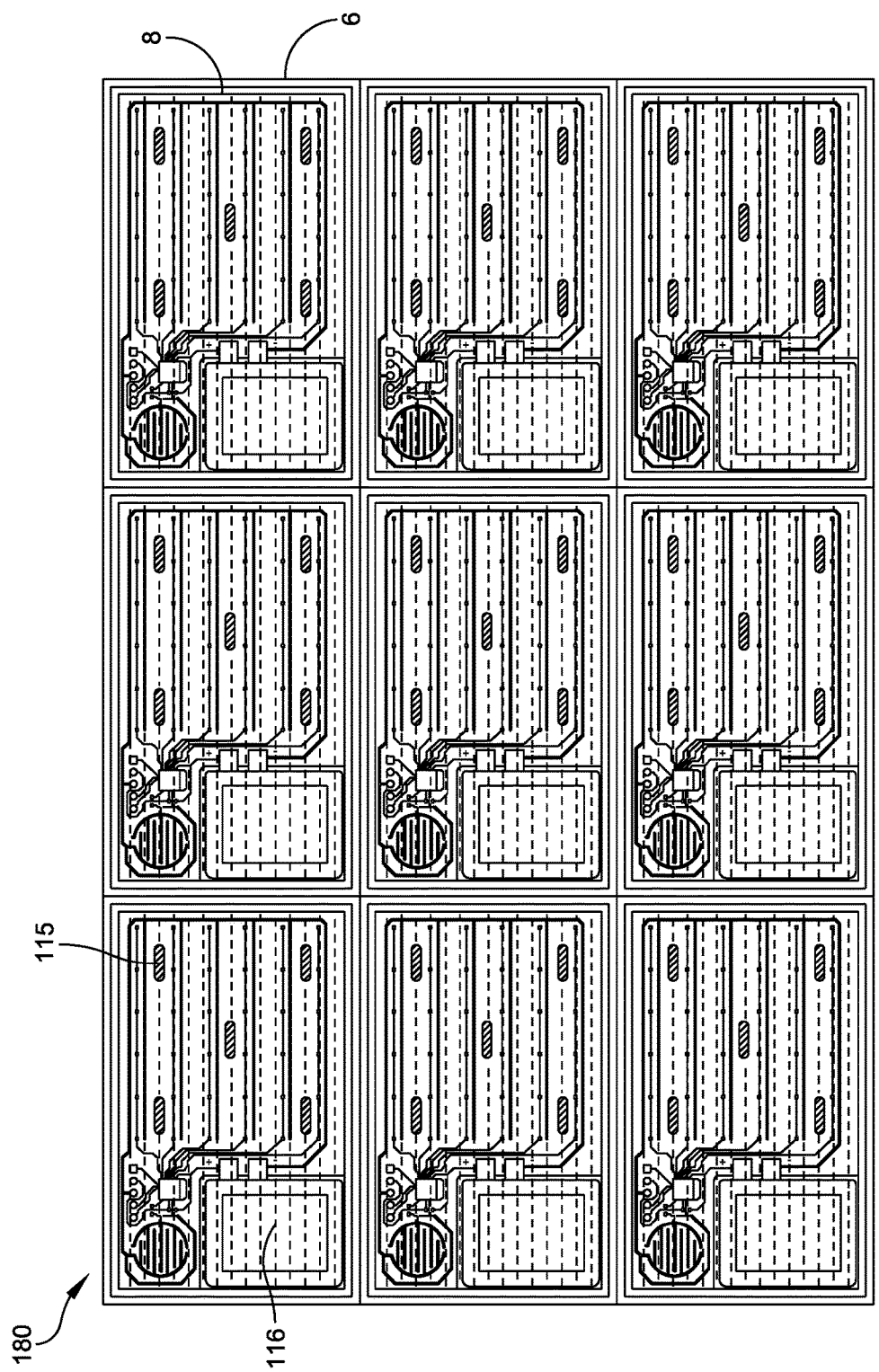
FIG. 26 is a schematic drawing illustrating an exemplary core layer structure for a plurality a plurality of information carrying cards during an exemplary manufacturing process, in accordance with some embodiments.

The exemplary processes 70 and 150 can be used to make a plurality of information carrying cards on one sheet, in accordance with some embodiments. Referring to FIG. 26, in such process, a first thermoplastic layer 6 comprises a plurality of cavity, in which an inlay layer 8 is disposed partially or fully into each cavity. Referring to FIG. 26, like items are indicated by like reference numerals, and descriptions of the structure, provided above with reference are also described above.

An exemplary core layer structure 180 comprising a plurality of inlay layer 8 can be fabricated using process 70 as described above. In some embodiments, each inlay layer 8 is fixed onto the first thermoplastic layer 6 with an instant adhesive 115 using an exemplary process 120 (FIG. 19). Each inlay layer 8 is cut with a plurality of holes before an instant adhesive 115 is applied. Referring again to FIG. 8, in some embodiments, an exemplary core layer 80 also comprises a cross-linked polymer composition 16. Inlay layer 8 comprises electronic components 10, for example, at least one printed circuit board (PCB), supporting film 12, and interconnects 14. Cross-linked polymer composition 16 fills the voids and remaining spaces inside the cavity on first thermoplastic layer 6 and inlay layer 8. In some embodiments, Cross-linked polymer composition 16 directly contacts the outer surface of electronic components 10.

Referring again to FIG. 5, a crosslinkable polymer composition 16 is disposed over the inlay layer inside each cavity to form the crosslinked polymer composition. A crosslinkable polymer composition 16 comprises a crosslinkable polymer resin and a thermoplastic filler. An exemplary crosslinkable composition comprises a base polymer resin and a particulate thermoplastic filler. The base polymer resin is urethane acrylate, ester acrylate, silicone acrylate, epoxy acrylate, acrylates including methacrylate, silicone, urethane, epoxy or the like. The particulate thermoplastic filler may be polyolefin, polyvinyl chloride (PVC), a copolymer of vinyl chloride and at least another monomer, or a polyester such as polyethylene terephthalate (PET). The particulate thermoplastic filler may be a compound or a blend comprising a thermoplastic polymer such as PVC or a vinyl chloride copolymer. For example, an exemplary composition may comprise urethane acrylate as the basic polymer resin, and a filler of PVC modified with a copolymer of vinyl chloride and at least another monomer such as vinyl ester or vinyl ether. The crosslinkable composition 16 is cured to form a crosslinked composition. Examples of curing method include but are not limited to thermal and radiation curing. In some embodiments, thermal curing occurs during a thermal lamination process.

In some embodiments, the exemplary core layer structure 180 is further laminated with at least one printable thermoplastic layer and a transparent film. The resulting laminated structure is then cut to form a plurality of information carrying cards. In some embodiments, the pressure is preferably less than 2 MPa. The temperature is in the range of 65-232° C. in some embodiments, and is preferably less than 150° C. in some embodiments in the lamination process.

Rectangular shaped information carrying cards or smart cards in this disclosure are for illustration only. The disclosure structure and process of making also apply to any information carrying card or part of any shapes and any size. Examples of these parts include but are not limited to rectangular sheets, circular sheets, strips, rods and rings. The size includes but is not limited to any size following ISO/IEC 7810 standard.

Although the subject matter has been described in terms of exemplary embodiments, it is not limited thereto. Rather, the appended claims should be construed broadly, to include other variants and embodiments, which may be made by those skilled in the art.

What is claimed is:

1. A core layer for a plurality of information carrying cards, comprising
    a thermoplastic layer defining a plurality of cavities therein, each cavity having a continuous surface profile solely defined by and inside the thermoplastic layer, the continuous surface profile having a bottom wall surface and a side wall surface;
    a plurality of inlay layers, each inlay layer comprising a supporting film, and at least one electronic component embedded or mounted on the supporting film, the at least one electronic component partially or fully disposed inside each respective cavity; and
    a crosslinked polymer composition disposed in each cavity and contacting the at least one electronic component, the crosslinked polymer composition comprising:
        a base polymer resin selected from the group consisting of urethane acrylate, ester acrylate, silicone acrylate, epoxy acrylate, methacrylate, silicone, urethane and epoxy, wherein the crosslinked polymer composition at least partially defines an outer surface of the core layer and has at least one portion disposed above a respective inlayer layer and below the outer surface.

2. The core layer of claim 1 wherein the thermoplastic layer comprises a material selected from the group consisting of polyvinyl chloride, copolymer of vinyl chloride, polyolefin, polycarbonate, polyester, polyamide, and acrylonitrile butadiene styrene copolymer (ABS).

3. The core layer of claim 1 wherein the at least one electronic component comprises at least one integrated circuit (IC), wherein the at least one IC is partially or fully disposed inside each respective cavity and over the thermoplastic layer.

4. The core layer of claim 1 wherein the base polymer resin in the crosslinked polymer composition is epoxy or urethane acrylate.

5. The core layer of claim 1 further comprising a piece of metal.

6. The core layer of claim 5 wherein the piece of metal comprises platinum, copper or tungsten.

7. The core layer of claim 1 wherein the at least one electronic component comprises a battery.

8. The core layer of claim 1 wherein at least one of the plurality of cavities has a size larger than that of a respective inlay layer, and the respective inlay layer is fully disposed inside the at least one of the plurality of cavities.

9. The core layer of claim 1 wherein at least one of the plurality of cavities has a size the same as or slightly larger than that of a respective inlay layer, and has a shape matching with that of the respective inlay layer.

10. The core layer of claim 1 wherein at least one of the plurality of cavities has a size smaller than that of a respective inlay layer, and the respective inlay layer is partially disposed inside the at least one of the plurality of cavities.

11. A core layer for a plurality of information carrying cards, comprising
    a thermoplastic layer defining a plurality of cavities therein, each cavity having a continuous surface profile solely defined by and inside the thermoplastic layer, the continuous surface profile having a bottom wall surface and a side wall surface;
    a plurality of inlay layers, each inlay layer comprising a supporting film, and at least one electronic component embedded or mounted on the supporting film, the at least one electronic component partially or fully disposed inside each respective cavity, wherein each inlay layer comprises a piece of metal; and
    a crosslinked polymer composition disposed in the plurality of cavities and contacting the at least one electronic component, the crosslinked polymer composition comprising:
        a base polymer resin selected from the group consisting of urethane acrylate, ester acrylate, silicone acrylate, epoxy acrylate, methacrylate, silicone, urethane and epoxy, wherein the crosslinked polymer composition at least partially defines an outer surface of the core layer and has at least one portion disposed above a respective inlayer layer and below the outer surface,
    wherein each cavity has a size the same as or smaller than that of a respective inlay layer.

12. The core layer of claim 11 wherein the piece of metal comprises platinum, copper or tungsten.

13. The core layer of claim 11 wherein the base polymer resin in the crosslinked polymer composition is epoxy or urethane acrylate.

14. The core layer of claim 11 wherein the thermoplastic layer comprises polyvinyl chloride or copolymer of vinyl chloride.

15. A manufacture comprising the core layer of claim 1 and having the plurality of information carrying cards.

16. The manufacture of claim 15 wherein the base polymer resin in the crosslinked polymer composition is epoxy or urethane acrylate.

17. An information carrying card, comprising
a thermoplastic layer defining at least one cavity therein, each cavity having a continuous surface profile solely defined by and inside the thermoplastic layer, the continuous surface profile having a bottom wall surface and a side wall surface;
at least one inlay layer comprising a supporting film, and at least one electronic component embedded or mounted on the supporting film, the at least one electronic component partially or fully disposed inside the at least one cavity, wherein the at least one inlay layer comprises a piece of metal; and
a crosslinked polymer composition disposed in the at least one cavity and contacting the at least one electronic component, the crosslinked polymer composition comprising:
 a base polymer resin selected from the group consisting of urethane acrylate, ester acrylate, silicone acrylate, epoxy acrylate, methacrylate, silicone, urethane and epoxy,
 wherein the crosslinked polymer composition has at least one portion disposed above the at least one inlayer layer;
 wherein the at least one cavity has a size the same as or smaller than that of the at least one inlay layer.

18. The information carrying card of claim 17 wherein the base polymer resin in the crosslinked polymer composition is epoxy or urethane acrylate.

19. The information carrying card of claim 17 further comprising
at least one printable thermoplastic film laminated onto a surface of the thermoplastic layer and the crosslinked polymer composition, and
at least one transparent film laminated onto a surface of the at least one printable thermoplastic film.

* * * * *

UNITED STATES PATENT AND TRADEMARK OFFICE
CERTIFICATE OF CORRECTION

| | |
|---|---|
| PATENT NO. | : 10,392,502 B2 |
| APPLICATION NO. | : 15/606944 |
| DATED | : August 27, 2019 |
| INVENTOR(S) | : Mark A. Cox |

It is certified that error appears in the above-identified patent and that said Letters Patent is hereby corrected as shown below:

In the Claims

Column 16, Line 4, replace "inlayer" with --inlay--

Column 18, Line 6, replace "inlayer" with --inlay--

Signed and Sealed this
Twenty-second Day of October, 2019

Andrei Iancu
*Director of the United States Patent and Trademark Office*